United States Patent
Hua et al.

(10) Patent No.: US 11,622,424 B2
(45) Date of Patent: Apr. 4, 2023

(54) DETECTOR FOR HEATING APPLIANCE

(71) Applicant: NXP USA, Inc., Austin, TX (US)

(72) Inventors: Qi Hua, Wu Xi (CN); Tonghe Liu, Pudong new district (CN); Changyang Wang, Shanghai (CN); Dong Wu, Carlsbad, CA (US); David Paul Lester, Phoenix, AZ (US); Lionel Mongin, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 677 days.

(21) Appl. No.: 16/666,589

(22) Filed: Oct. 29, 2019

(65) Prior Publication Data

US 2020/0389949 A1 Dec. 10, 2020

(30) Foreign Application Priority Data

Jun. 6, 2019 (CN) .......................... 201910495618.2

(51) Int. Cl.
*H05B 6/72* (2006.01)
*H05B 6/64* (2006.01)
*H05B 6/68* (2006.01)

(52) U.S. Cl.
CPC ............. *H05B 6/72* (2013.01); *H05B 6/6402* (2013.01); *H05B 6/6432* (2013.01); *H05B 6/6447* (2013.01); *H05B 6/683* (2013.01)

(58) Field of Classification Search
CPC .... G01R 29/0878; H05B 6/50; H05B 6/6402; H05B 6/6432; H05B 6/6447; H05B 6/683; H05B 6/72
USPC ....... 219/748, 746, 750, 695, 696, 697, 690, 219/694, 702, 704, 709, 715, 716
See application file for complete search history.

(56) References Cited

U.S. PATENT DOCUMENTS

| | | | |
|---|---|---|---|
| 3,641,427 A | 2/1972 | Pittman et al. | |
| 4,162,381 A * | 7/1979 | Buck .................... | H05B 6/6458 426/243 |
| 6,215,112 B1 | 10/2001 | Kim et al. | |
| 6,385,739 B1 | 5/2002 | Barton et al. | |
| 7,381,933 B2 | 6/2008 | Cristiani | |
| 9,239,188 B2 | 1/2016 | Adrian et al. | |

(Continued)

FOREIGN PATENT DOCUMENTS

| | | |
|---|---|---|
| CN | 1080555 A | 1/1994 |
| CN | 1764332 A | 4/2006 |

(Continued)

OTHER PUBLICATIONS

Micronor Inc.; "Fiber Optic Temperature Sensor TS2 Rev. B"; retrieved from the internet http://micronor.com; 2 pages (Jan. 13, 2016).

(Continued)

*Primary Examiner* — Quang T Van

(57) ABSTRACT

A device includes an antenna configured to be disposed within a cavity of an appliance. The appliance includes an electrode and the antenna includes a sheet of conductive material having a surface area that is equal to or greater than a surface area of the electrode. The device includes a voltage sensor coupled to the antenna, an output device, and a controller coupled to the voltage sensor and the output device. The controller is configured to generate an output at the output device. The output is determined by a voltage of the antenna.

20 Claims, 9 Drawing Sheets

(56) References Cited

U.S. PATENT DOCUMENTS

| | | | |
|---|---|---|---|
| 9,602,165 | B2 | 3/2017 | Greuet |
| 10,088,436 | B2 | 10/2018 | Ben Haim et al. |
| 10,425,999 | B2 | 9/2019 | Einziger et al. |
| 10,433,376 | B2 | 10/2019 | Chaimov et al. |
| 10,856,372 | B2 | 12/2020 | Schneider et al. |
| 10,925,125 | B2 | 2/2021 | Hua et al. |
| 2007/0187396 | A1 | 8/2007 | Kim |
| 2013/0080098 | A1 | 3/2013 | Hadad et al. |
| 2015/0136760 | A1 | 5/2015 | Lima et al. |
| 2016/0095171 | A1 | 3/2016 | Chaimov et al. |
| 2018/0042074 | A1 | 2/2018 | Qiu et al. |
| 2019/0051497 | A1 | 2/2019 | Long et al. |
| 2020/0029401 | A1 | 1/2020 | Höynälä |

FOREIGN PATENT DOCUMENTS

| | | |
|---|---|---|
| CN | 102374998 A | 3/2012 |
| CN | 109323521 A | 12/2019 |
| EP | 1253753 A2 | 10/2002 |
| EP | 2648636 B1 | 3/2014 |
| EP | 2884249 B1 | 6/2015 |
| JP | 2007173171 A | 7/2007 |
| WO | WO-2010/150317 A1 | 12/2010 |

OTHER PUBLICATIONS

Micronor Inc.; "FOTEMP4 User Manual"; retrieved from the internet http://micronor.com; 28 pages (Aug. 2013).

Roland, U. et al; "A New Fiber Optical Thermometer and its Application for Process Control in Strong Electric, Magnetic, and Electromagnetic Fields"; Sensor Letters, vol. 1, No. 1; pp. 93-98 (Sep. 2003).

\* cited by examiner

DETECTOR FOR HEATING APPLIANCE

CROSS-REFERENCE TO RELATED APPLICATIONS

This application claims the priority under 35 U.S.C. § 119 of Chinese patent application no. 201910495618.2, filed Jun. 6, 2019 the contents of which are incorporated by reference herein.

TECHNICAL FIELD

Embodiments of the subject matter described herein relate generally to an apparatus for and methods of monitoring an operation of a heating or defrosting appliance.

BACKGROUND

Capacitive food heating systems include planar electrodes contained within a heating compartment. After a food load is placed between the electrodes and the electrodes are brought into proximity with the food load, electromagnetic radio frequency (RF) energy is supplied to the electrodes to provide gentle warming of the food load.

During mass production of capacitive or RF-based food defrosting or heating systems, it may be desirable to test a manufactured system to ensure that the system's RF energy output meets certain requirements indicating that the system is operating as desired and according to specification. In conventional testing approaches, the energy output of a defrosting system may be evaluated by measuring temperature rises in dummy or sample loads subjected to a heating operation. In such an approach, the dummy load is placed into the system being tested. The system then executes a heating operation on the dummy load in a testing operation for a predetermined period of time (e.g., 5 minutes). By comparing the temperature of the dummy load at the beginning of the heating operation to the temperature at the end of the operation, it is possible to determine whether the system is operating within specification. Specifically, if the test heating operation raised the temperature of the dummy load by a required temperature amount, that indicates that the power output of the heating system is adequate and meets specification.

Such temperature-based testing approaches, however, can be excessively time consuming as the testing operation may require several minutes for the dummy load to be sufficiently warmed to evaluate that system's performance. Additionally, the testing approaches may require the use of expensive fiber-optic thermometers that will not be affected by the RF energy output of the heating system. Accordingly, such temperature-based approaches for evaluating the performance of capacitive or RF-based defrosting or heating systems may not be well suited to the testing of a large numbers of systems, as required for the evaluation of mass-produced heating systems.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
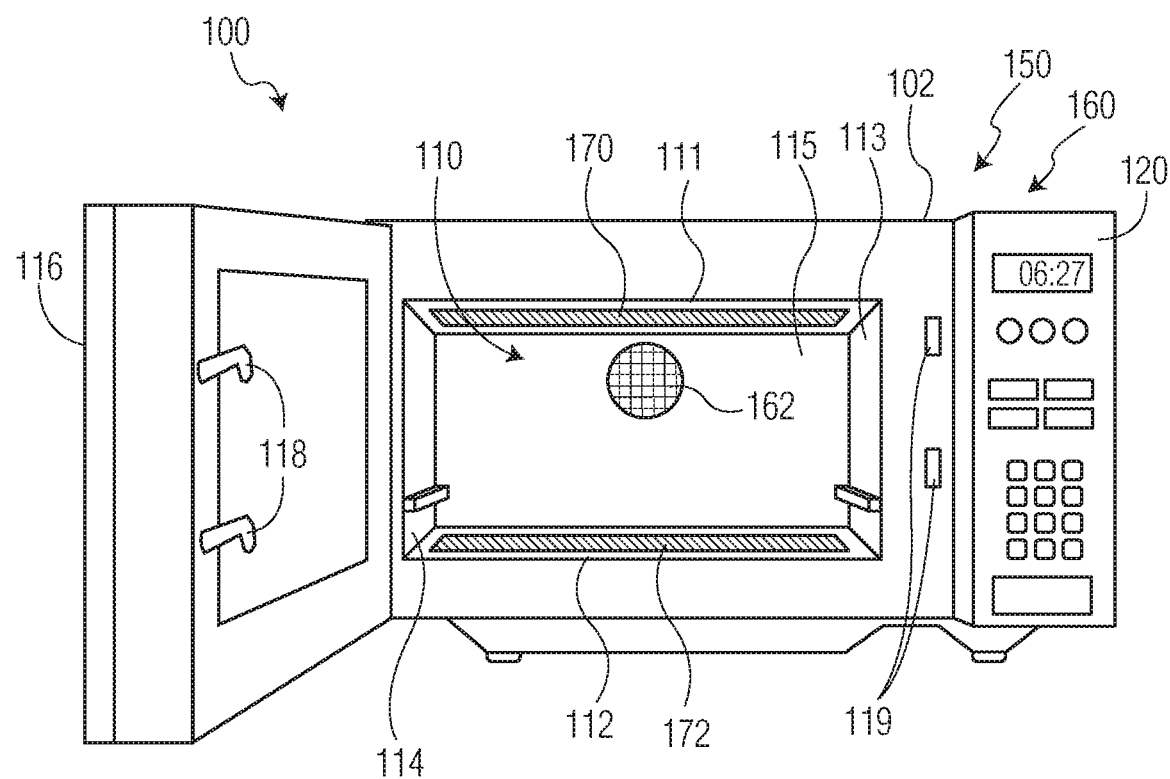
FIG. 1 is a perspective view of a heating appliance with a radio frequency (RF) heating system and a thermal heating system, in accordance with an example embodiment.

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

Embodiments of the subject matter described herein relate to devices for testing the operation of an appliance configured to heat or warm a food load using radio frequency (RF) energy. Example heating appliances, apparatus, and/or systems may include multiple heating systems that can operate simultaneously in order to heat a load (e.g., a food load) within a heating cavity to defrost or warm that load. In an embodiment, the appliance may include only an RF heating system. The RF heating system includes a solid-state RF signal source, a variable impedance matching network, and two electrodes, where the two electrodes are separated by the heating cavity. More specifically, the RF heating system is a "capacitive" heating system, in that the two electrodes function as electrodes (or plates) of a capacitor, and the capacitor dielectric essentially includes the portion of the cavity between the two electrodes and any load contained therein.

In other embodiments, the appliance may optionally include multiple heating systems that include an RF heating system and a "thermal" heating system. The thermal heating system can include any one or more systems that heat the air within the cavity, such as one or more resistive heating elements, a convection blower, a convection fan plus a resistive heating element, a gas heating system, among others.

Embodiments of the RF heating system, which is included in the heating appliance along with the optional thermal heating system, differ from a conventional microwave oven system in several respects. For example, embodiments of the RF heating system include a solid-state RF signal source, as opposed to a magnetron that is utilized in a conventional microwave oven system. Utilization of a solid-state RF signal source may be advantageous over a magnetron, in that a solid-state RF signal source may be significantly lighter and smaller, and may be less likely to exhibit performance degradation (e.g., power output loss) over time. In addition, embodiments of the RF heating system generate electromagnetic energy in the system cavity at frequencies that are significantly lower than the 2.54 gigahertz (GHz) frequency that is typically used in conventional microwave oven systems. In some embodiments, for example, embodiments of the RF heating system generate electromagnetic energy in the system cavity at frequencies within the VHF (very high frequency) range (e.g., from 30 megahertz (MHz) to 300 MHz). The significantly lower frequencies utilized in the various embodiments may result in deeper energy penetration into the load, and thus potentially faster and more even heating. Further still, embodiments of the RF heating system include a single-ended or double-ended variable impedance matching network, which is dynamically controlled based on the magnitude of reflected RF power. This dynamic control enables the system to provide a good match between the RF signal generator and the system cavity (plus load) throughout a heating process, which may result in increased system efficiency and reduced heating time.

When manufacturing heating appliances that include RF heating systems, either in combination with other types of heating systems (e.g., thermal heating systems) or alone, it may be desirable to test a manufactured appliance to ensure the appliance's RF energy output meets quality control requirements.

Conventional testing protocols call for testing heating appliances by operating the heating appliance on a dummy load and measuring the increase in the dummy load's temperature. If the temperature of the dummy load has increased by a sufficient amount within a prescribed time frame, it may be determined that the heating appliance is operating adequately and the appliance's power output is within specification. But such temperature-based testing approaches can be very time consuming, as the test operation may need to be run for several minutes before a sufficient temperature increase in the temperature in the dummy load is observed. Additionally, for heating appliances that utilize RF heating systems, such temperature-based testing techniques may require the use of fiber-optic-based thermometers, which can increase the expense of testing operations. Conventional thermometers may not be useful as their operation can be affected by the RF energy generated by the RF heating system.

Accordingly, the present disclosure provides a wireless energy detector configured to monitor the RF energy output of an RF heating system of a heating appliance. The detector is configured to be disposed within the heating cavity of a heating appliance that includes an RF heating system. With the detector positioned within the heating cavity, the RF heating system of the heating appliance is operated in a simulation of a food load heating activity. Specifically, the heating appliance is operated so that the appliance's RF heating system is activated and causes RF energy to be supplied to the electrodes of the RF heating system, resulting in an electric field being established within the appliance's heating cavity.

The wireless detector is configured to determine a magnitude of the electromagnetic energy within the heating cavity of the heating appliance being tested. If the magnitude of the electromagnetic energy falls within an acceptable range, it may be determined that the RF heating system of the heating appliance is operating properly. Specifically, the wireless detector includes an antenna configured to be disposed within the heating cavity. The electromagnetic field (or electric field) generated by the RF heating system within the heating cavity couples to the detector's antenna resulting in a voltage being induced at the antenna. The magnitude of the voltage has a linear relationship to the electromagnetic energy within the heating cavity. Accordingly, by comparing the voltage measured at the detector's antenna to threshold values, the detector can indirectly determine whether the RF power output of the appliance's RF heating system is within specification.

The detector may include different interfaces for reporting data indicative of whether a particular heating appliance's RF heating system is operating within specifications. The detector may include a visual or audible output system configured to notify a user of whether a particular heating appliance is within specification. For example, the detector may include a visual output device, such as a display screen (e.g., a liquid crystal display (LCD) screen) or a plurality of light emitting diodes (LEDs) configured to generate a visual output based on the detected RF power for a particular testing operation. If, following a test operation, the detector determines that the RF power generated by the appliance's RF heating system satisfies the specification, the screen may display a message indicating that the appliance met the test, or a colored LED (e.g., a green LED) may be illuminated. Such output notifies a user of the detector that the appliance has passed the test operation. Conversely, a different output (e.g., a message displayed on the LCD screen that the appliance "failed" the test, or illuminating a red LED) may be generated in the event that an appliance fails to meet specification. The detector may also include an audible output system that can generate different audible output (e.g., different tones or sounds) depending upon whether a particular heating appliance has met or failed to meet the required specifications for output RF power.

In some embodiments, the detector may include a data communications interface configured to transmit data captured during a test operation to a remote computer system. The communications interface may include a wireless communications interface, such as a BLUETOOTH or WIFI network interface or a wired interface, such as a fiber optic network interface. The detector may use the communications interface to transmit data values based upon measurements taken during a testing operation of an RF heating system of a heating appliance (e.g., the voltage values measured at the detector's antenna) to a remote computer system. The remote computer system may then be configured to analyze the received data values to determine whether the heating appliance being tested has met the required specifications for RF energy output. Alternatively, the detector may itself analyze the measurements taken during the testing operation to determine whether the RF heating system of the heating appliance has met the required specifications and may then transmit the result of that determination to a remote computer system using the communications interface.

Data transmitted by the detector using the communications interface may be transmitted in real-time (e.g., while a testing operation is ongoing), or at a later time (e.g., following the completion of the testing operation).

Generally, the term "heating" means to elevate the temperature of a load (e.g., a food load or other type of load). The term "defrosting", which also may be considered a "heating" operation, means to elevate the temperature of a frozen load (e.g., a frozen food load or other type of load) to a temperature at which the load is no longer frozen (e.g., a temperature at or near 0 degrees Celsius). As used herein, the term "heating" more broadly means a process by which the thermal energy or temperature of a load (e.g., a food load or other type of load) is increased through provision of thermal radiation of air particles and/or RF electromagnetic energy to the load. Accordingly, in various embodiments, a "heating operation" may be performed on a load with any initial temperature (e.g., any initial temperature above or below 0 degrees Celsius), and the heating operation may be ceased at any final temperature that is higher than the initial temperature (e.g., including final temperatures that are above or below 0 degrees Celsius). That said, the "heating operations" and "heating systems" described herein alternatively may be referred to as "thermal increase operations" and "thermal increase systems."

FIG. 1 is a perspective view of a heating system 100 (or appliance), in accordance with an example embodiment. Heating system 100 includes a heating cavity 110 (e.g., cavity 260 FIG. 2), a control panel 120, an RF heating system 150 (e.g., RF heating system 210, FIG. 2), and a thermal heating system 160 (e.g., thermal heating system 250 FIG. 2), all of which are secured within a system housing 102. The heating cavity 110 is defined by interior surfaces of top, bottom, side, and back cavity walls 111, 112, 113, 114, 115 and an interior surface of door 116. As shown in FIG. 1, door 116 may include a latching mechanism 118, which engages with a corresponding securing structure 119 of the system housing 102 to hold door 116 closed. With door 116 closed, the heating cavity 110 defines an enclosed air cavity. As used herein, the terms "air cavity" or "oven cavity" may mean an enclosed area that contains air or other gasses (e.g., heating cavity 110).

In some embodiments, one or more shelf support structures (not shown) are accessible within the heating cavity 110 and configured to hold a removable and repositionable shelf at some height above the bottom cavity wall 112. In some embodiments, the shelf support structures are configured to provide an electrical connection between the shelf (e.g., an electrode embodied in the shelf) and other portions of the RF heating system or a ground reference. In some embodiments, the shelf may simply be configured to hold a load (e.g., a food load of wireless detector) at a desired height above the bottom cavity wall 112.

Heating system 100 includes both an RF heating system 150 (e.g., RF heating system 210, FIG. 2), and a thermal heating system 160, which heats the air in heating cavity and may include any of resistive heating elements, a convection blower, a convection fan plus a resistive heating element, a gas heating system, or other heating elements.

As will be described in greater detail below, the RF heating system 150 includes one or more radio frequency (RF) signal sources (e.g., RF signal source 220, FIG. 2), a power supply (e.g., power supply 226, FIG. 2), a first electrode 170 (e.g., electrode 240, FIG. 2), a second electrode 172 (e.g., electrode 242, FIG. 2), impedance matching circuitry (e.g., circuits 270, FIG. 2), power detection circuitry (e.g., power detection circuitry 230, FIG. 2), and an RF heating system controller (e.g., system controller 212, FIG. 2).

The first electrode 170 is arranged proximate to a cavity wall (e.g., top wall 111), and the second electrode 172 is arranged proximate to an opposite, second cavity wall (e.g., bottom wall 112). Alternatively, as indicated above, the second electrode 172 may be replaced by a removable shelf structure or an electrode within such a shelf structure. Either way, the first and second electrodes 170, 172 are electrically isolated from the remaining cavity walls (e.g., walls 113-115 and door 116), and the cavity walls are grounded. In either configuration, the system may be simplistically modeled as a capacitor, where the first electrode 170 functions as one conductive plate (or electrode), the second electrode 172 functions as a second conductive plate (or electrode), and the air cavity between the electrodes (including any load contained therein) functions as a dielectric medium between the first and second conductive plates.

The RF heating system 150 may be an "unbalanced" RF heating system or a "balanced" RF heating system, in various embodiments. As will be described in more detail later in conjunction with FIG. 2, when configured as an "unbalanced" RF heating system, the system 150 includes a single-ended amplifier arrangement (e.g., amplifier arrangement 220, FIG. 2), and a single-ended impedance matching network (e.g., including networks 234, 270, FIG. 2) coupled between an output of the amplifier arrangement and the first electrode 170, and the second electrode 172 is grounded. Although alternatively the first electrode 170 could be grounded, and the second electrode 172 could be coupled to the amplifier arrangement. In contrast, when configured as a "balanced" RF heating system, the system 150 includes a single-ended or double-ended amplifier arrangement, and a double-ended impedance matching network coupled between an output of the amplifier arrangement and the first and second electrodes 170, 172. In either the balanced or unbalanced embodiments, the impedance matching network includes a variable impedance matching network that can be adjusted during the heating operation to improve matching between the amplifier arrangement and the cavity (plus load). Further, a measurement and control system can detect certain conditions related to the heating operation (e.g., an empty system cavity, a poor impedance match, and/or completion of a heating operation).

The thermal heating system 160 includes a thermal system controller (e.g., thermal system controller 252, FIG. 2), a power supply, a heating element, an optional fan, and a thermostat, in an embodiment. The heating element may be, for example, a resistive heating element, which is configured to heat air surrounding the heating element when current from the power supply is passed through the heating element. The thermostat (or oven sensor) senses the temperature of the air within the system cavity, and based on the sensed cavity temperature, controls the power supply to provide current to the heating element. More specifically, the thermostat operates to maintain the cavity air temperature at or near the temperature setpoint. In addition, the thermal system controller may selectively activate and deactivate the convection fan to circulate air warmed by the heating element within the system cavity 110. In the system 100 illustrated in FIG. 1, the fan is located in a fan compartment outside of the system cavity 110, and fluid (air) communication between the fan and the system cavity 110 is provided through one or more openings in one or more cavity walls. For example, FIG. 1 illustrates an opening 162 corresponding to an air outlet in cavity wall 115 between a fan compartment and the system cavity 110. In other embodiments, air circulated by such a convection system may be heated by a heating source that is not internal to the convection system, such as a distinct heating element within the cavity or an activated burner.

Referring again to FIG. 1, and according to an embodiment, during operation of the heating system 100, a user (not illustrated) may first place one or more loads (e.g., food and/or liquids or the wireless detector) into the heating cavity 110, and close the door 116. As indicated previously, the user may place the load(s) on the bottom cavity wall 112, on an insulating layer over the bottom cavity wall, or on a rotating plate (not illustrated). Alternatively, as indicated previously, the user may place the load(s) on a shelf that is inserted into the cavity 110 at any supported position.

To initiate a cooking process, the user may specify a type of cooking (or cooking mode) that the user would like the system 100 to implement. The user may specify the cooking mode through the control panel 120 (e.g., by pressing a button or making a cooking mode menu selection). According to an embodiment, the system 100 is capable of implementing at least the following distinct cooking modes: 1) convection-only cooking; 2) RF-only cooking; and 3) combined convection and RF cooking. For the convection-only cooking mode (mode 1, above), the convection system 160 is activated during the cooking process, and the RF heating system 150 is idle or deactivated. For the RF-only cooking mode (mode 2, above, including RF-only defrosting), the RF heating system 150 is activated during the cooking process, and the convection system 160 is idle or deactivated. Finally, for combined convection and RF cooking mode (mode 3, above), both the convection system 160 and the RF heating system 150 are activated during the cooking process. In this mode, both the convection system 160 and the RF heating system 150 may be activated simultaneously and continuously, or either system may be deactivated during portions of the process.

To begin the heating operation, the user may provide a "start" input via the control panel 120 (e.g., the user may depress a "start" button). In response, a host system controller (e.g., host/thermal system controller 252, FIG. 2) sends appropriate control signals to the thermal heating system 150 and/or the RF heating system 160 throughout the cooking process, depending on which cooking mode is being implemented.

When performing RF-only cooking or combined convection and RF cooking, the system selectively activates and controls the RF heating system 150 in a manner in which maximum RF power transfer may be absorbed by the load throughout the cooking process. During the heating operation, the impedance of the load (and thus the total input impedance of the cavity 110 plus load) changes as the thermal energy of the load increases. The impedance changes alter the absorption of RF energy into the load, and thus alter the magnitude of reflected power. According to an embodiment, power detection circuitry (e.g., power detection circuitry 230, FIG. 2) continuously or periodically measures the reflected power along a transmission path between the RF signal source and the system electrode(s) 170 and/or 172. Based on these measurements, an RF heating system controller (e.g., RF heating system controller 212, FIG. 2) may alter the state of the variable impedance matching network (e.g., networks 270, FIG. 2) during the heating operation to increase the absorption of RF power by the load. In addition, in some embodiments, the RF system controller may detect completion of the heating operation (e.g., when the load temperature has reached a target temperature) based on feedback from the power detection circuitry.

The heating system 100 of FIG. 1 is embodied as a counter-top type of appliance. Those of skill in the art would understand, based on the description herein, that embodiments of heating systems may be incorporated into systems or appliances having other configurations, as well. Accordingly, the above-described implementations of heating systems in a stand-alone appliance are not meant to limit use of the embodiments only to those types of systems. Instead, various embodiments of heating systems may be incorporated into wall-cavity installed appliances, and systems that include multiple types of appliances incorporated in a common housing.

Further, although heating system 100 is shown with its components in particular relative orientations with respect to one another, it should be understood that the various components may be oriented differently, as well. In addition, the physical configurations of the various components may be different. For example, control panel 120 may have more, fewer, or different user interface elements, and/or the user interface elements may be differently arranged. In addition, although a substantially cubic heating cavity 110 is illustrated in FIG. 1, it should be understood that a heating cavity may have a different shape, in other embodiments (e.g., cylindrical, and so on). Further, heating system 100 may include additional components (e.g., a stationary or rotating plate within the cavity, an electrical cord, and so on) that are not specifically depicted in FIG. 1.

Figure 2:
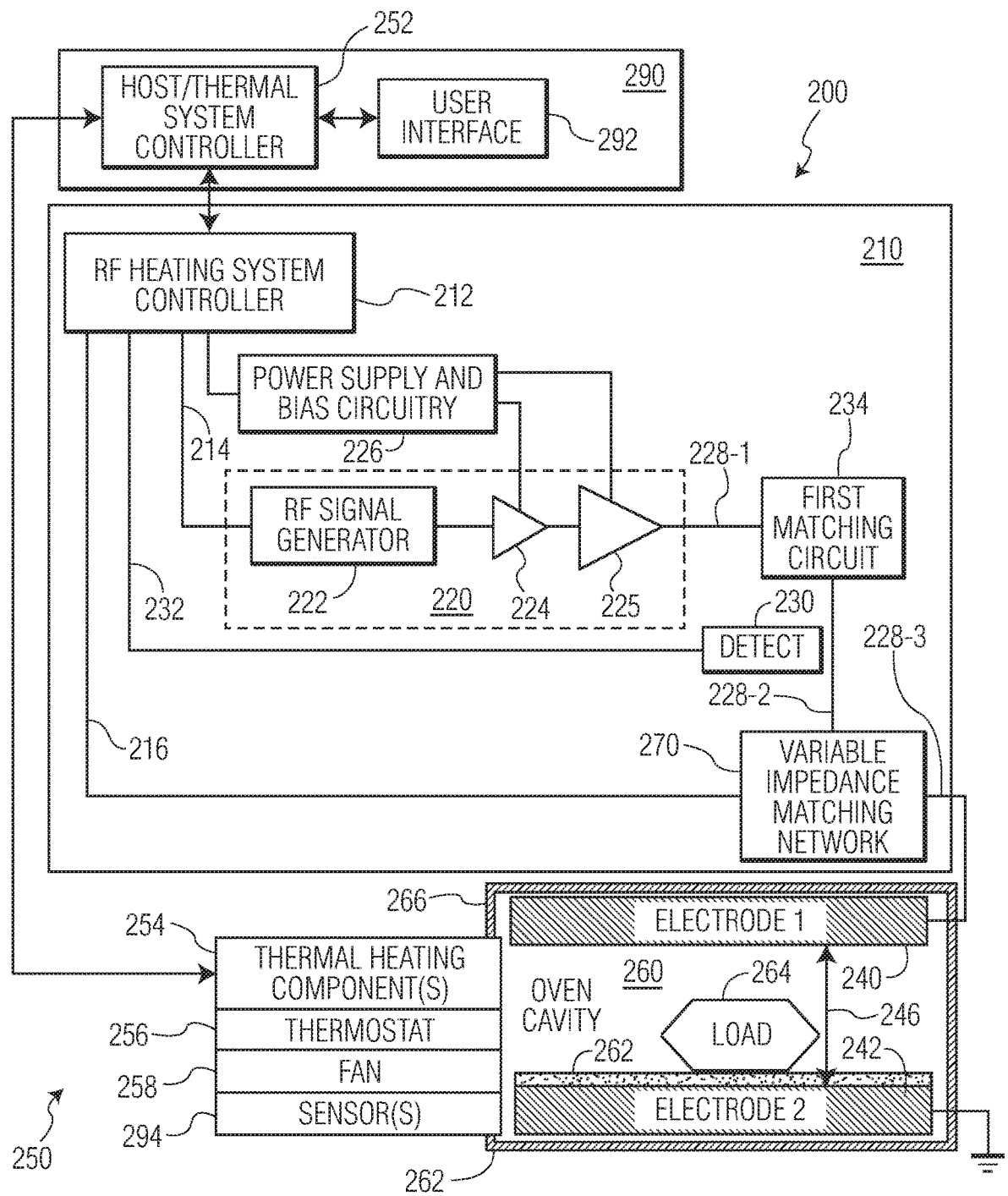
FIG. 2 is a simplified block diagram of a heating apparatus with an RF heating system and a thermal heating system, in accordance with an example embodiment.

FIG. 2 is a simplified block diagram of an unbalanced heating system 200 (e.g., heating system 100 of FIG. 1), in accordance with an example embodiment. Heating system 200 includes host/thermal system controller 252, RF heating system 210, thermal heating system 250, user interface 292, and a containment structure 266 that defines an oven cavity 260, in an embodiment. It should be understood that FIG. 2 is a simplified representation of a heating system 200 for purposes of explanation and ease of description, and that practical embodiments may include other devices and components to provide additional functions and features, and/or the heating system 200 may be part of a larger electrical system.

The containment structure 266 may include bottom, top, and side walls, the interior surfaces of which define the cavity 260 (e.g., cavity 110, FIG. 1). According to an embodiment, the cavity 260 may be sealed (e.g., with a door 116, FIG. 1) to contain the heat and electromagnetic energy that is introduced into the cavity 260 during a heating operation. The system 200 may include one or more interlock mechanisms (e.g., latching mechanisms and securing structures 118, 119, FIG. 1) that ensure that the seal is intact during a heating operation.

User interface 292 may correspond to a control panel (e.g., control panel 120, FIG. 1), for example, which enables a user to provide inputs to the system regarding parameters for a heating operation. In addition, the user interface may be configured to provide user-perceptible outputs indicating the status of a heating operation (e.g., a countdown timer, visible indicia indicating progress or completion of the heating operation, and/or audible tones indicating completion of the heating operation) and other information.

The thermal heating system 250 includes host/thermal system controller 252, one or more thermal heating components 254, thermostat 256, and in some embodiments, a fan 258. In some embodiments, host/thermal system controller 252 and portions of user interface 292 may be included together in a host module 290.

Host/thermal system controller 252 is configured to receive signals indicating user inputs received via user interface 292, and to provide signals to the user interface 292 that enable the user interface 292 to produce user-perceptible outputs (e.g., via a display, speaker, and so on) indicating various aspects of the system operation. In addition, host/thermal system controller 252 sends control signals to other components of the thermal heating system 250 (e.g., to thermal heating components 254 and fan 258) to selectively activate, deactivate, and otherwise control those other components in accordance with desired system operation. The host/thermal system controller 252 also may receive signals from the thermal heating system components 254, thermostat 256, and sensors 294 (if included), indicating operational parameters of those components, and the host/thermal system controller 252 may modify operation of the system 200 accordingly, as will be described later. Further still, host/thermal system controller 252 receives signals from the RF heating system controller 212 regarding operation of the RF heating system 210. Responsive to the received signals and measurements from the user interface 292 and from the RF heating system controller 212, host/thermal system controller 252 may provide additional control signals to the RF heating system controller 212, which affects operation of the RF heating system 210.

The one or more thermal heating components 254 may include components that are configured to heat air within the oven cavity 260. The thermostat 256 (or an oven sensor) is configured to sense the air temperature within the oven cavity 260, and to control operation of the one or more thermal heating components 254 to maintain the air temperature within the oven cavity at or near a temperature setpoint. Finally, fan 258 is included when the system 200 includes a convection system, and the fan 258 is selectively activated and deactivated to circulate the air within the oven cavity 260.

The RF heating system 210 includes RF heating system controller 212, RF signal source 220, power supply and bias circuitry 226, first impedance matching circuit 234 (herein "first matching circuit"), variable impedance matching network 270, first and second electrodes 240, 242, and power detection circuitry 230, in an embodiment. According to an embodiment, RF heating system controller 212 is coupled to host/thermal system controller 252, RF signal source 220, variable impedance matching network 270, power detection circuitry 230, and sensors 294 (if included). RF heating system controller 212 is configured to receive control signals from the host/thermal system controller 252 indicating various operational parameters, and to receive signals indicating RF signal reflected power (and possibly RF signal forward power) from power detection circuitry 230. Responsive to the received signals and measurements, RF heating system controller 212 provides control signals to the power supply and bias circuitry 226 and to the RF signal generator 222 of the RF signal source 220. In addition, RF heating system controller 212 provides control signals to the variable impedance matching network 270, which cause the network 270 to change its state or configuration.

Oven cavity 260 includes a capacitive heating arrangement with first and second parallel plate electrodes 240, 242 that are separated by an air cavity 260 within which a load 264 to be heated may be placed. For example, a first electrode 240 may be positioned above the air cavity 260, and a second electrode 242 may be positioned below the air cavity 260. In some embodiments, the second electrode 242 may be implemented in the form of a shelf or contained within a shelf that is inserted in the cavity 260 as previously described. In other embodiments, a distinct second electrode 242 may be excluded, and the functionality of the second electrode may be provided by a portion of the containment structure 266 (i.e., the containment structure 266 may be considered to be the second electrode, in such an embodiment). According to an embodiment, the containment structure 266 and/or the second electrode 242 are connected to a ground reference voltage (i.e., containment structure 266 and second electrode 242 are grounded). The first and second electrodes 240, 242 are positioned within containment structure 266 to define a distance 246 between the electrodes 240, 242, where the distance 246 renders the cavity 260 a sub-resonant cavity, in an embodiment.

In general, an RF heating system 210 designed for lower operational frequencies (e.g., frequencies between 10 MHz and 100 MHz) may be designed to have a distance 246 that is a smaller fraction of one wavelength. For example, when system 210 is designed to produce an RF signal with an operational frequency of about 10 MHz (corresponding to a wavelength of about 30 meters), and distance 246 is selected to be about 0.5 meters, the distance 246 is about one 60th of one wavelength of the RF signal. Conversely, when system 210 is designed for an operational frequency of about 300 MHz (corresponding to a wavelength of about 1 meter), and distance 246 is selected to be about 0.5 meters, the distance 246 is about one half of one wavelength of the RF signal.

With the operational frequency and the distance 246 between electrodes 240, 242 being selected to define a sub-resonant interior cavity 260, the first and second electrodes 240, 242 are capacitively coupled. More specifically, the first electrode 240 may be analogized to a first plate of a capacitor, the second electrode 242 may be analogized to a second plate of a capacitor, and the load 264, barrier 262 (if included), and air within the cavity 260 may be analogized to a capacitor dielectric. Accordingly, the first electrode 240 alternatively may be referred to herein as an "anode," and the second electrode 242 may alternatively be referred to herein as a "cathode."

Essentially, the voltage across the first electrode 240 and the second electrode 242 contributes to heating the load 264 within the cavity 260. According to various embodiments, the RF heating system 210 is configured to generate the RF signal to produce voltages between the electrodes 240, 242 in a range of about 20 volts to about 3000 volts, in one embodiment, or in a range of about 3000 volts to about 10,000 volts, in another embodiment, although the system 210 may be configured to produce lower or higher voltages between the electrodes 240, 242, as well.

The first electrode 240 is electrically coupled to the RF signal source 220 through a first matching circuit 234, a variable impedance matching network 270, and a conductive transmission path, in an embodiment. The first matching circuit 234 is configured to perform an impedance transformation from an impedance of the RF signal source 220 (e.g., less than about 10 ohms) to an intermediate impedance (e.g., 50 ohms, 75 ohms, or some other value). According to an embodiment, the conductive transmission path includes a plurality of conductors 228-1, 228-2, and 228-3 connected in series, and referred to collectively as transmission path 228. According to an embodiment, the conductive transmission path 228 is an "unbalanced" path, which is configured to carry an unbalanced RF signal (i.e., a single RF signal referenced against ground). In some embodiments, one or more connectors (not shown, but each having male and female connector portions) may be electrically coupled along the transmission path 228, and the portion of the transmission path 228 between the connectors may comprise a coaxial cable or other suitable connector.

The variable impedance matching circuit 270 is configured to perform an impedance transformation from the above-mentioned intermediate impedance to an input impedance of oven cavity 260 as modified by the load 264 (e.g., on the order of hundreds or thousands of ohms, such as about 1000 ohms to about 4000 ohms or more). In an embodiment, the variable impedance matching network 270 includes a network of passive components (e.g., inductors, capacitors, resistors).

According to an embodiment, RF signal source 220 includes an RF signal generator 222 and a power amplifier (e.g., including one or more power amplifier stages 224, 225). In response to control signals provided by RF heating system controller 212 over connection 214, RF signal generator 222 is configured to produce an oscillating electrical signal having a frequency in the ISM (industrial, scientific, and medical) band, although the system could be modified to support operations in other frequency bands, as well. The RF signal generator 222 may be controlled to produce oscillating signals of different power levels and/or different frequencies, in various embodiments. For example, the RF signal generator 222 may produce a signal that oscillates in the VHF (very high frequency) range (i.e., in a range between about 30.0 megahertz (MHz) and about 300 MHz), and/or in a range of about 10.0 MHz to about 100 MHz, and/or from about 100 MHz to about 3.0 gigahertz (GHz). Some desirable frequencies may be, for example, 13.56 MHz (+/−5 percent), 27.125 MHz (+/−5 percent), 40.68 MHz (+/−5 percent), and 2.45 GHz (+/−5 percent). In one particular embodiment, for example, the RF signal generator 222 may produce a signal that oscillates in a range of about 40.66 MHz to about 40.70 MHz and at a power level in a range of about 10 decibel-milliwatts (dBm) to about 15 dBm. Alternatively, the frequency of oscillation and/or the power level may be lower or higher.

In the embodiment of FIG. 2, the power amplifier includes a driver amplifier stage 224 and a final amplifier stage 225. The power amplifier is configured to receive the oscillating signal from the RF signal generator 222, and to amplify the signal to produce a significantly higher-power signal at an output of the power amplifier. For example, the output signal may have a power level in a range of about 100 watts to about 400 watts or more. The gain applied by the power amplifier may be controlled using gate bias voltages and/or drain supply voltages provided by the power supply and bias circuitry 226 to each amplifier stage 224, 225. More specifically, power supply and bias circuitry 226 provides bias and supply voltages to each RF amplifier stage 224, 225 in accordance with control signals received from RF heating system controller 212.

In FIG. 2, the power amplifier arrangement is depicted to include two amplifier stages 224, 225 coupled in a particular manner to other circuit components. In other embodiments, the power amplifier arrangement may include other amplifier topologies and/or the amplifier arrangement may include only one amplifier stage, or more than two amplifier stages. For example, the power amplifier arrangement may include various embodiments of a single-ended amplifier, a Doherty amplifier, a Switch Mode Power Amplifier (SMPA), or another type of amplifier.

Oven cavity 260 and any load 264 (e.g., food, liquids, and so on) positioned in the oven cavity 260 present a cumulative load for the electromagnetic energy (or RF power) that is radiated into the cavity 260 by the first electrode 240. More specifically, the cavity 260 and the load 264 present an impedance to the system, referred to herein as a "cavity plus load impedance." The cavity plus load impedance changes during a heating operation as the temperature of the load 264 increases. The cavity plus load impedance has a direct effect on the magnitude of reflected signal power along the conductive transmission path 228 between the RF signal source 220 and electrode 240. In most cases, it is desirable to maximize the magnitude of transferred signal power into the cavity 260, and/or to minimize the reflected-to-forward signal power ratio along the conductive transmission path 228.

In order to at least partially match the output impedance of the RF signal generator 220 to the cavity plus load impedance, a first matching circuit 234 is electrically coupled along the transmission path 228, in an embodiment. The first matching circuit 234 may have any of a variety of configurations. According to an embodiment, the first matching circuit 234 includes fixed components (i.e., components with non-variable component values), although the first matching circuit 234 may include one or more variable components, in other embodiments. For example, the first matching circuit 234 may include any one or more circuits selected from an inductance/capacitance (LC) network, a series inductance network, a shunt inductance network, or a combination of bandpass, high-pass and low-pass circuits, in various embodiments. Essentially, the fixed matching circuit 234 is configured to raise the impedance to an intermediate level between the output impedance of the RF signal generator 220 and the cavity plus load impedance.

According to an embodiment, power detection circuitry 230 is coupled along the transmission path 228 between the output of the RF signal source 220 and the electrode 240. In a specific embodiment, the power detection circuitry 230 forms a portion of the RF subsystem 210, and is coupled to the conductor 228-2 between the output of the first matching circuit 234 and the input to the variable impedance matching network 270, in an embodiment. In alternate embodiments, the power detection circuitry 230 may be coupled to the portion 228-1 of the transmission path 228 between the output of the RF signal source 220 and the input to the first matching circuit 234, or to the portion 228-3 of the transmission path 228 between the output of the variable impedance matching network 270 and the first electrode 240.

Wherever it is coupled, power detection circuitry 230 is configured to monitor, measure, or otherwise detect the power of the reflected signals traveling along the transmission path 228 between the RF signal source 220 and electrode 240 (i.e., reflected RF signals traveling in a direction from electrode 240 toward RF signal source 220). In some embodiments, power detection circuitry 230 also is configured to detect the power of the forward signals traveling along the transmission path 228 between the RF signal source 220 and the electrode 240 (i.e., forward RF signals traveling in a direction from RF signal source 220 toward electrode 240). Over connection 232, power detection circuitry 230 supplies signals to RF heating system controller 212 conveying the magnitudes of the reflected signal power (and the forward signal power, in some embodiments). In embodiments in which both the forward and reflected signal power magnitudes are conveyed, RF heating system controller 212 may calculate a reflected-to-forward signal power ratio, or an S11 parameter, or a voltage standing wave ration (VSWR) value. As will be described in more detail below, when the reflected signal power magnitude exceeds a reflected signal power threshold, or when the reflected-to-forward signal power ratio exceeds an S11 parameter threshold, or when a VSWR value exceeds a VSWR threshold, this indicates that the system 200 is not adequately matched to the cavity plus load impedance, and that energy absorption by the load 264 within the cavity 260 may be sub-optimal. In such a situation, RF heating system controller 212 orchestrates a process of altering the state of the variable matching network 270 to drive the reflected signal power or the S11 parameter or the VSWR value toward or below a desired level (e.g., below the reflected signal power threshold, and/or the reflected-to-forward signal power ratio threshold, and/or the S11 parameter threshold, and/or the VSWR threshold), thus re-establishing an acceptable match and facilitating more optimal energy absorption by the load 264.

For example, the RF heating system controller 212 may provide control signals over control path 216 to the variable matching circuit 270, which cause the variable matching circuit 270 to vary inductive, capacitive, and/or resistive values of one or more components within the circuit, thus adjusting the impedance transformation provided by the circuit 270. Adjustment of the configuration of the variable matching circuit 270 desirably decreases the magnitude of reflected signal power, which corresponds to decreasing the magnitude of the S11 parameter and/or VSWR, and increasing the power absorbed by the load 264.

As discussed above, the variable impedance matching network 270 is used to match the cavity plus load impedance of the oven cavity 260 plus load 264 to maximize, to the extent possible, the RF power transfer into the load 264. The initial impedance of the oven cavity 260 and the load 264 may not be known with accuracy at the beginning of a heating operation. Further, the impedance of the load 264 changes during a heating operation as the load 264 warms up. According to an embodiment, the RF heating system controller 212 may provide control signals to the variable impedance matching network 270, which cause modifications to the state of the variable impedance matching network 270. This enables the RF heating system controller 212 to establish an initial state of the variable impedance matching network 270 at the beginning of the heating operation that has a relatively low reflected to forward power ratio, and thus a relatively high absorption of the RF power by the load 264. In addition, this enables the RF heating system controller 212 to modify the state of the variable impedance matching network 270 so that an adequate match may be maintained throughout the heating operation, despite changes in the impedance of the load 264.

Some embodiments of heating system 200 may include temperature sensor(s), IR sensor(s), and/or weight sensor(s) 294. The temperature sensor(s) and/or IR sensor(s) may be positioned in locations that enable the temperature of the load 264 to be sensed during the heating operation. When provided to the host/thermal system controller 252 and/or the RF heating system controller 212, for example, the temperature information enables the host/thermal system controller 252 and/or the RF heating system controller 212 to alter the power of the thermal energy produced by the thermal heating components 254 and/or the RF signal supplied by the RF signal source 220 (e.g., by controlling the bias and/or supply voltages provided by the power supply and bias circuitry 226), and/or to determine when the heating operation should be terminated. In addition, the RF heating system controller 212 may use the temperature information to adjust the state of the variable impedance matching network 270. The weight sensor(s) are positioned under the load 264, and are configured to provide an estimate of the weight and/or mass of the load 264 to the host/thermal system controller 252 and/or the RF heating system controller 212. The host/thermal system controller 252 and/or RF heating system controller 212 may use this information, for example, to determine an approximate duration for the heating operation. Further, the RF heating system controller 212 may use this information to determine a desired power level for the RF signal supplied by the RF signal source 220, and/or to determine an initial setting for the variable impedance matching network 270.

The description associated with FIG. 2 discuss, in detail, an "unbalanced" heating apparatus, in which an RF signal is applied to one electrode (e.g., electrode 240, FIG. 2), and the other electrode (e.g., electrode 242 or the containment structure 266, FIG. 2) is grounded. As mentioned above, an alternate embodiment of a heating apparatus comprises a "balanced" heating apparatus. In such an apparatus, balanced RF signals are provided to both electrodes (e.g., by a push-pull amplifier).

When manufacturing heating appliances that include RF heating systems, either in combination with other types of heating systems (e.g., thermal heating systems) or alone, it may be desirable to test a manufactured appliance to ensure the appliance's RF energy output meets quality control specifications. To test the operation of a heating appliance, a wireless energy detector is configured to monitor the RF energy output of the appliance's RF heating system, according to an embodiment. Based upon the measurements captured by the detector, heating appliances with RF heating systems that are not performing according to device specifications can be identified.

The detector is configured to be disposed within the heating cavity of a heating appliance that includes an RF heating system, in an embodiment. With the detector positioned within the heating cavity, the heating appliance is operated in a simulation of a food load heating activity. Specifically, the heating appliance is operated so that the appliance's RF heating system is activated and causes RF energy to be supplied to the electrodes of the RF heating system, resulting in an electric field being established within the appliance's heating cavity.

The wireless detector includes an antenna configured to absorb and couple to that electric field. As a result, the electric field causes a corresponding voltage to be generated at or induced within the detector's antenna. The magnitude of the voltage of the detector's antenna is therefore indicative of the magnitude of the electric field within the appliance's heating cavity. By measuring the voltage at the detector's antenna, therefore, the detector can determine a magnitude of the electric field and, in turn, the RF power within the heating cavity. If the measured voltage falls within a target range, indicating that the RF power falls similarly falls within an acceptable range, it may be determined that the RF heating system of the heating appliance is operating properly.

Figure 3A:
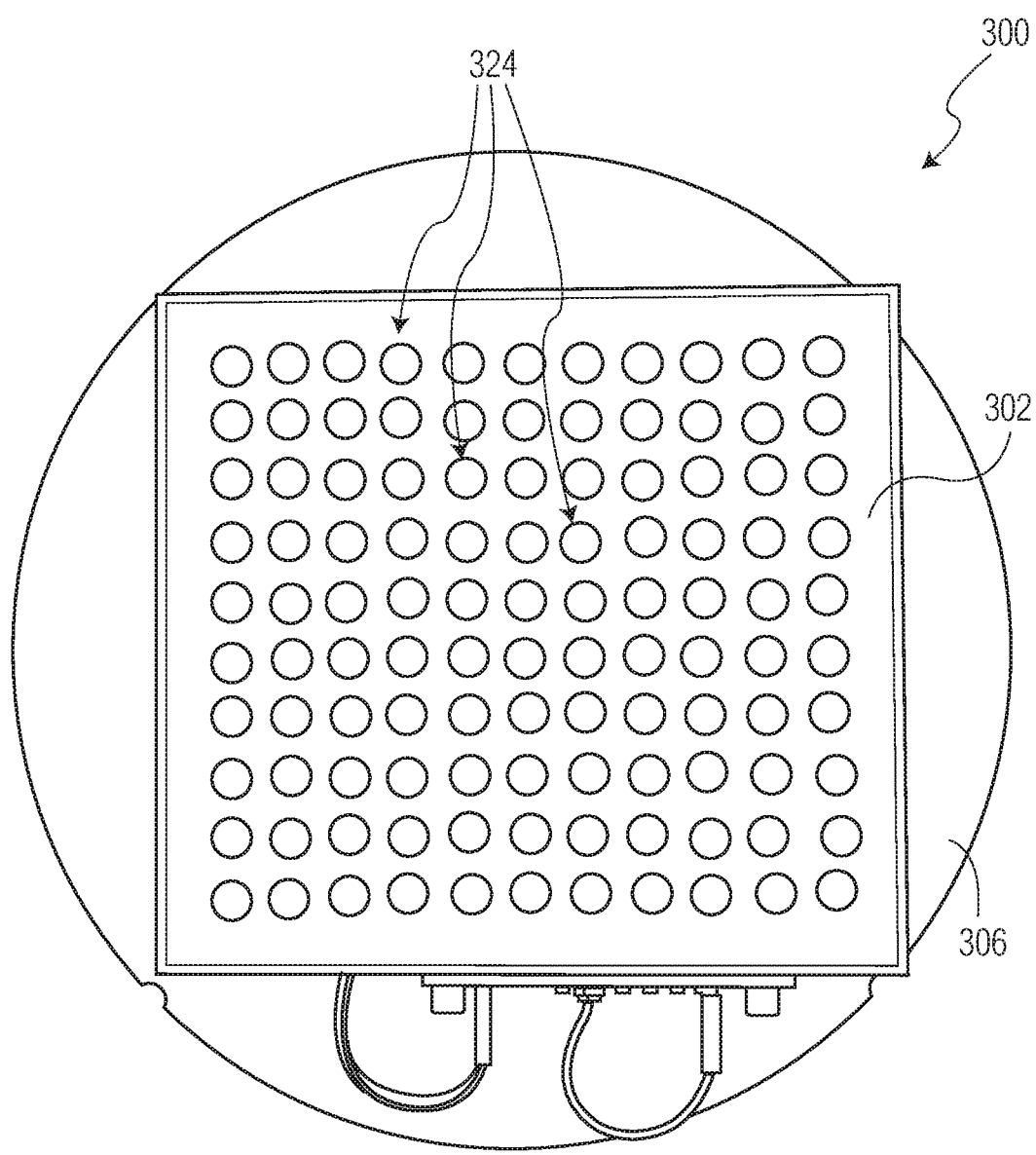
FIGS. 3A-3C depict a wireless detector that may be utilized to monitor the RF energy output of an RF heating system of a heating appliance.
Figure 3B:
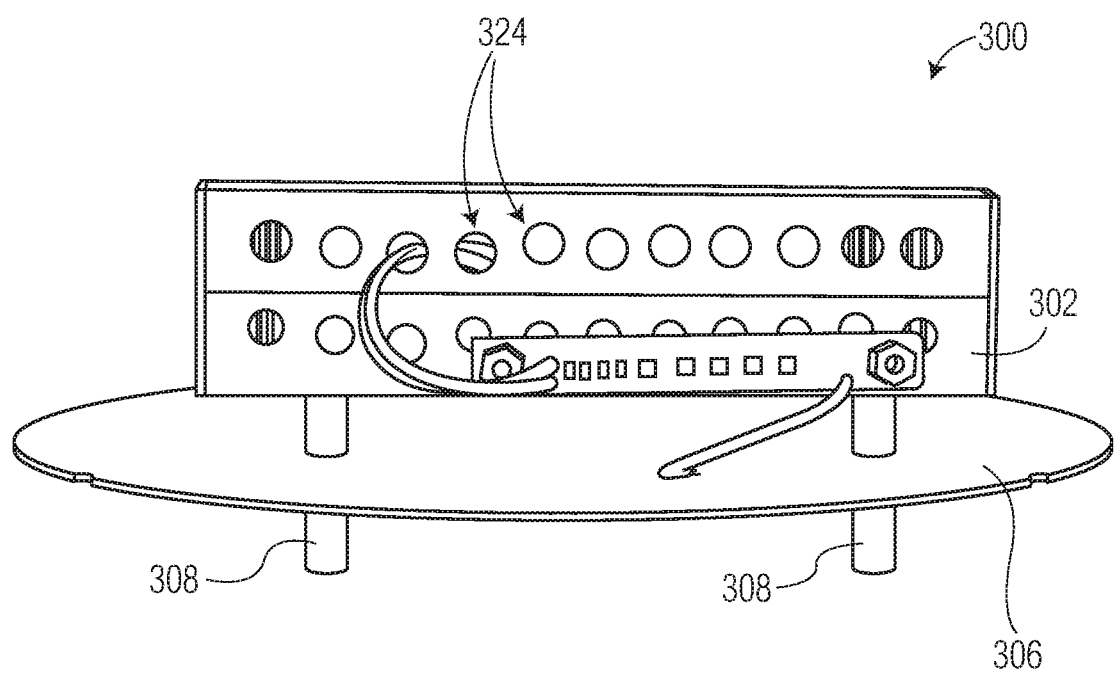
Figure 3C:
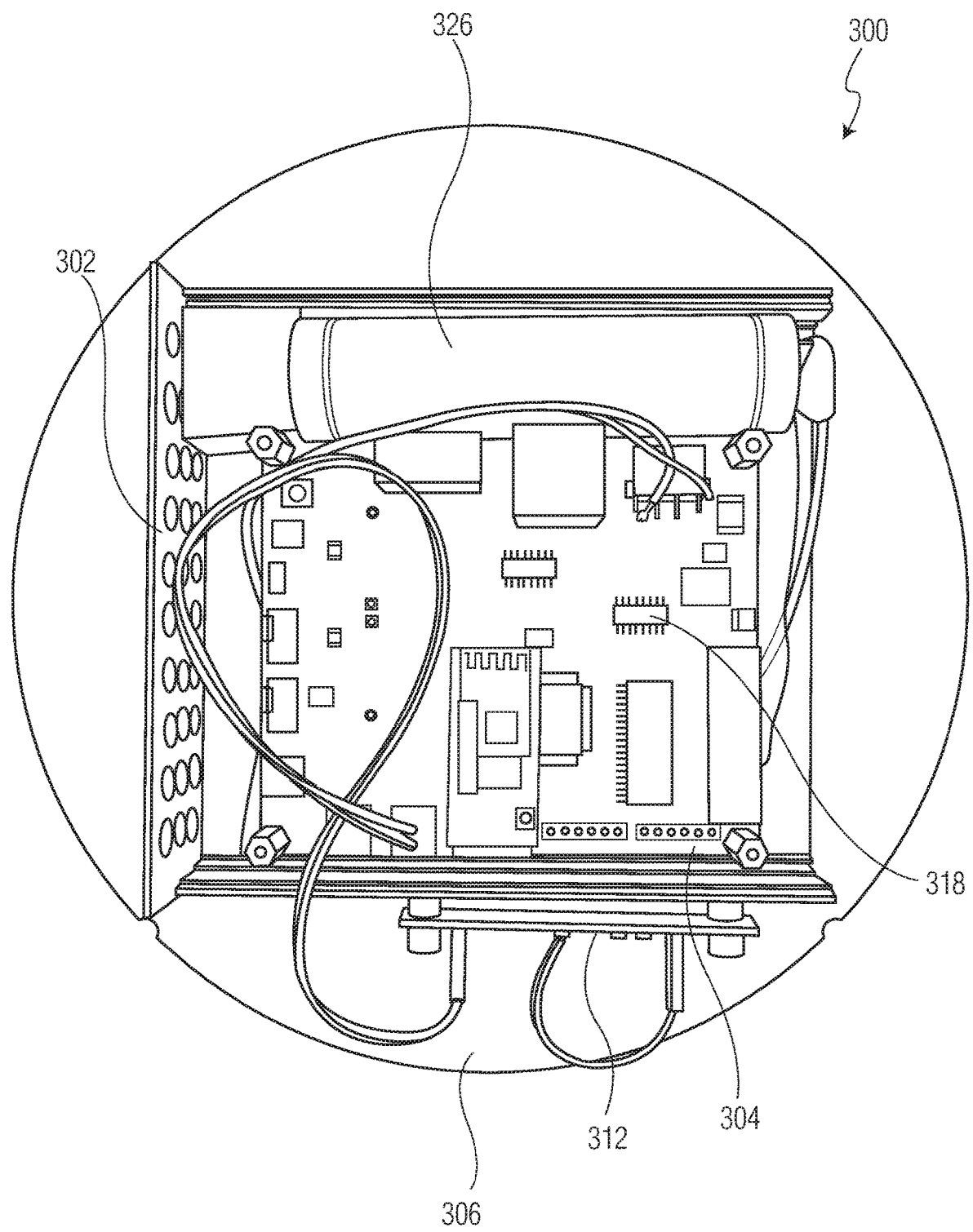
Figure 4:
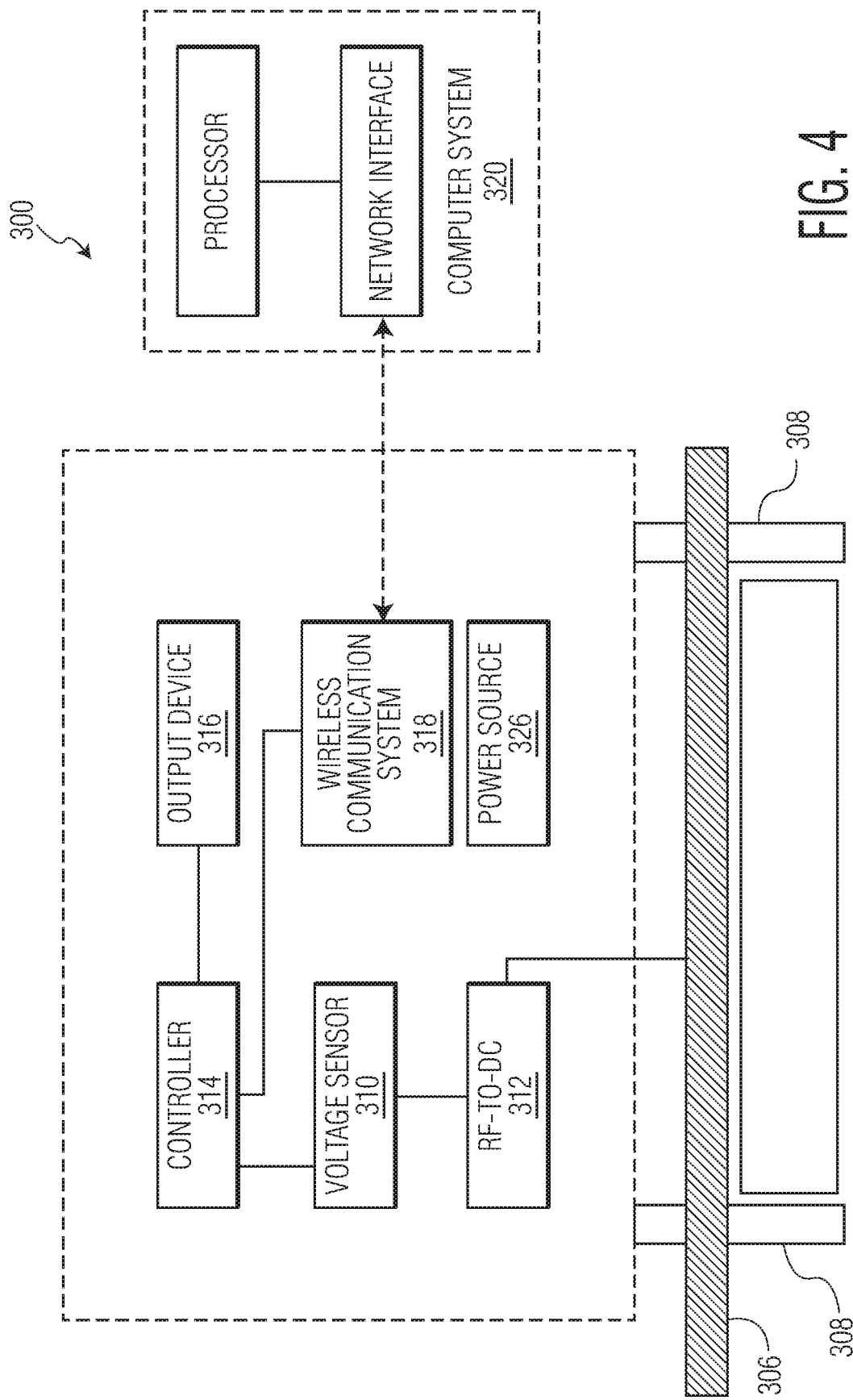
FIG. 4 is a block diagram depicting the interrelationships of functional components of the wireless detector of FIGS. 3A-3C.

FIGS. 3A-3C depict a wireless detector 300 that may be utilized to monitor the RF energy output of an RF heating system of a heating appliance. FIG. 3A depicts a top view of detector 300, while FIG. 3B depicts a side view of detector 300. FIG. 3C is a top view of detector 300 with a portion of housing 302 removed exposing a view of substrate 304 upon which components of detector 300 are mounted. FIG. 4 is a block diagram depicting the interrelationship of functional component of detector 300.

Detector 300 includes antenna 306. Antenna 306 is generally configured as a flat plate or sheet of conductive material (e.g., copper or aluminum) and may have a circular perimeter shape or may have another shape. Antenna 306 may have an outer perimeter that is circular or square in shape, or may have other outer perimeter shapes. In an embodiment, antenna 306 may have a similar construction and shape (i.e., outer perimeter shape) as one or more of the electrodes (e.g., electrodes 170, 172, 240, 242, FIGS. 1, 2) of the heating appliance being tested. Additionally, antenna 306 may be configured so that a surface area of antenna 306 is equal to or greater than a surface area of one or more of the electrodes (e.g., electrodes 170, 172, 240, 242, FIGS. 1, 2) of the heating appliance being tested. Although not necessary, providing that the surface area of antenna 306 is equal to or larger than an electrode of the heating appliance may provide for more efficient RF energy coupling between antenna 306 and the electric field created by the RF energy emitted into the heating cavity (e.g., cavity 110, 260, FIGS. 1, 2) of the heating appliance. In this manner, the relative surface areas of antenna 306 and the one or more of the electrodes (e.g., electrodes 170, 172, 240, 242, FIGS. 1, 2) of the heating appliance can be adjusted to control an amount of energy coupling from the electric field in the appliance's heating cavity to antenna 306.

Antenna 306 is generally sized so that when detector 300 is positioned within the heating cavity of a heating appliance, a minimum separation distance is maintained between the walls of the heating cavity (e.g., cavity walls 111, 112, 113, 114, 115 defining cavity 110, FIG. 1) and antenna 306. In an embodiment, the minimum separation distance may be 3 centimeters (cm), though different heating appliance and antenna 306 configurations may require different minimum separation distances.

Antenna 306 is mounted to stand-off legs 308. Legs 308 generally include a non-conductive material, such as plastic, nylon, ceramic or glass. Legs 308 may be fabricated as a unitary components that are inserted through holes formed in antenna 306. Or, alternatively, legs 308 may be fabricated as two separate components mounted (e.g., via non-conductive adhesive) to opposing surface of antenna 306. Legs 308 are sized so that when detector 300 is positioned within the heating cavity of a heating appliance, a minimum separation distance from the appliance's electrodes (e.g., electrodes 170, 172, 240, 242, FIGS. 1, 2) is maintained. The length of legs 308 may account for circumstances in which detector 300 is positioned in the heating appliance directly upon an electrode or on a shelf within the heating cavity of the heating appliance. A typical minimum separation distance between antenna 306 and the appliance's electrodes (e.g., electrodes 170, 172, 240, 242, FIGS. 1, 2) may be in the range of 2 cm to 5 cm, though in other appliance and antenna 306 configurations, legs 308 may be configured to provide different minimum separation distances.

Figure 5:
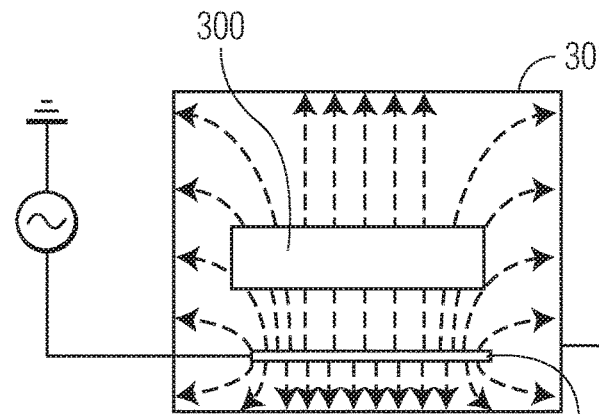
FIG. 5 depicts an example testing configuration that utilizes a wireless detector to monitor RF energy in a heating cavity.

With detector 300 positioned within the heating cavity of a heating appliance and the appliance's RF heating system operational, the electric field in the heating cavity couples to antenna 306 inducing a voltage therein. To illustrate, FIG. 5 depicts a typical testing setup in which a heating appliance's heating cavity 301 contains an electrode 303 and the appliance's RF heating system is applying RF energy to the electrode 303 resulting in a corresponding electric field being generated within heating cavity 301. Detector 300 is positioned within heating cavity 301 so as to be placed within the electric field. As described herein, detector 300 is then configured to detect and output a data value indicative of a strength of the electric field within heating cavity 301.

As shown in FIG. 4 detector 300 includes a voltage sensor 310 configured to measure the voltage induced in antenna 306. Typically, voltage sensor 310 includes an analog-to-digital converter configured to receive an analog voltage as input and convert that analog voltage into a digital value representing the magnitude of the measured analog voltage.

During operation of a heating appliance's RF heating system, relatively large voltages (e.g., up to or greater than hundreds of volts or thousands of volts) may be induced at the antenna 306 of detector 300. Additionally, because the voltage is induced by RF energy, the voltage may fluctuate at the same frequency as the RF energy (e.g., frequencies that may range from 10 MHz to 300 MHz, though different heating appliances may utilize different RF heating systems that emit RF energy in different frequency ranges).

Accordingly, voltage sensor 310 may be coupled to antenna 306 through a radio frequency-to-direct current (RF-to-DC) circuit 312. RF-to-DC circuit 312 is configured to both convert the fluctuating RF voltage of antenna 306 into a consistent or DC voltage, as well as output a voltage value that is only a fraction of the voltage induced in antenna 306. This reduction of voltage may serve to protect the components of voltage sensor 310 from the relatively high voltages that may be induced in antenna 306.

Figure 6:
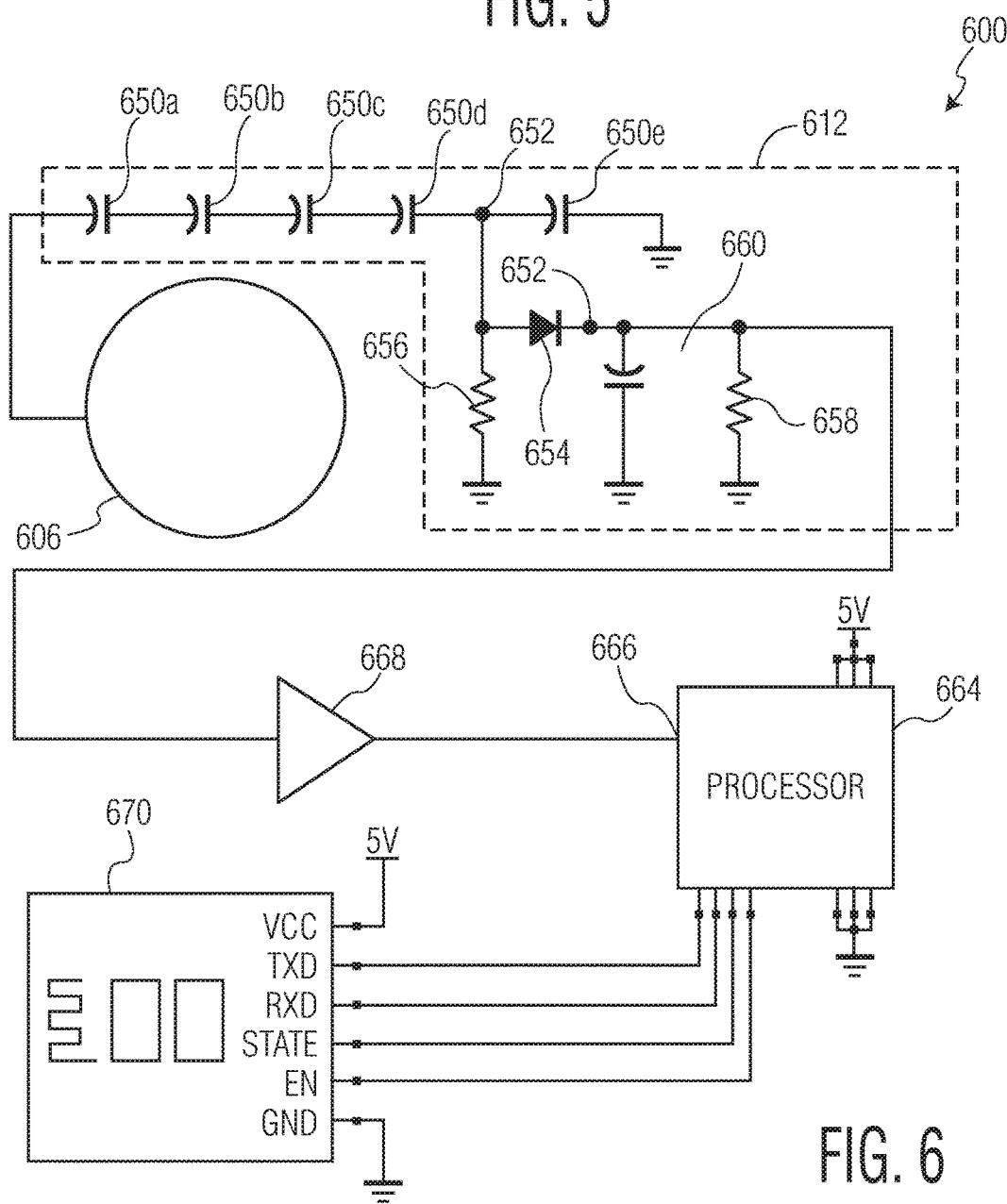
FIG. 6 is a schematic depicting components of a detector as well as the manner in which the components are interconnected.

FIG. 6 is a schematic depicting components of a detector 600 (e.g., detector 300, FIGS. 3A-3C, 4) as well as the manner in which the components are interconnected. As shown in FIG. 6, detector includes antenna 606 (e.g., antenna 306, FIGS. 3A-3C, 4). Antenna 606 is connected to RF-to-DC circuit 612 (e.g., RF-to-DC circuit 312, FIG. 4).

RF-to-DC circuit 612 includes a voltage divider network implemented by series-connected capacitors 650a - 650e. Antenna 606 is electrically connected directly to a first node of a first capacitor 650a in the array of series-connected capacitors 650a - 650e. The output of the voltage divider network is at node 652 between a second terminal of the second-to-last capacitor 650d in the series and the last capacitor 650e in the series. In an embodiment, each of capacitors 650a - 650d have the same capacitance value, while the capacitance of capacitor 650e may be different. By selecting appropriate capacitances of each of capacitors 650a - 650e the amount of voltage reduction provided by the voltage divider network of capacitors 650a -650e and can be controlled. For example, if capacitors 650a - 650d have capacitances of 2.2 picoFarads (pF) and capacitor 650e has a capacitance of 100 pF, the voltage divider network may output a voltage at node 652 that is $\frac{1}{180}$th of the input voltage received from antenna 306. In such a configuration, capacitors 650a - 650e may be implemented using high-Q RF capacitors capable of handling the relatively high voltages received from antenna 306.

Although the voltage divider network of RF-to-DC circuit 612 of FIG. 6 is implemented using capacitors 650a-650e, it should be understood the network could alternatively be implemented using different components (e.g., capacitors or inductors) having different component values as well as different numbers of components. For example, a resistor or diode-based voltage reduction network may be used in place of capacitors 650a-650e.

All such networks (or any other voltage reductions techniques) may be utilized to reduce the relatively high analog voltage received from antenna to lower voltage values easier to process within detector 600 and, specifically, by voltage sensor 310. In still some other embodiments of detector 600, however, such voltage reduction may not be required and the detector may be implemented without a voltage divider network or other voltage reduction circuitry. For example, the voltage induced in the antenna may be reduced by reducing the overall surface area of antenna 306. Accordingly, with sufficient reduction in the surface area of antenna 306 as compared to the surface area of the electrode of the heating appliance's RF heating system, the voltage reduction network of FIG. 6 may not be required.

The output of the voltage divider network of capacitors 650a-650e is connected to the input of diode 654. Diode 654, in combination with the low-pass filter made of resistors 656, 658 and capacitor 660, operates to rectify the reduced-voltage RF signal received from node 652 into a DC voltage that can, in turn, be passed to voltage sensor of detector 600. Node 662 at the output of diode 654 is therefore the output node of RF-to-DC circuit 612.

Referring to FIG. 4, detector 300 includes voltage sensor 310. Voltage sensor 310 receives the output of RF-to-DC circuit 312 (e.g., from output node 662 of RF-to-DC circuit 612, FIG. 6) and converts the analog voltage received therefrom into a digital value. The digital value is then passed to controller 314 for analysis and processing. The magnitude of the digital voltage value received from voltage sensor 310 is proportional to the magnitude of the electric field in the heating cavity of the heating appliance that is being tested. The electric field is, in turn, proportional to the magnitude of the RF energy that the RF heating system of the heating appliance is emitting into the heating cavity. Accordingly, controller 314 can compare the digital voltage value to threshold voltage values to determine whether the magnitude of the RF energy being generated by the appliance's RF heating system meets specification requirements. Or, alternatively and as described herein, controller 314 can transmit the digital values received from voltage sensor 310 to a remote computer system for analysis to determine whether the appliance meets requirements.

Referring to the schematic of FIG. 6, detector 600 includes processor 664. Processor 664 may include one or more general purpose or special purpose processors (e.g., a microprocessor, microcontroller, ASIC, and so on), volatile and/or non-volatile memory (e.g., RAM, ROM, flash, various registers, and so on), one or more communication busses, and other components. Processor 664 may be configured to implement the functionality of a voltage sensor (e.g., voltage sensor 310, FIG. 4) and a controller (e.g., controller 314, FIG. 4). Specifically, output node 662 of RF-to-DC circuit 612 is connected to input node 666 of processor 664 through amplifier 668. Amplifier 668 may implemented as an operational amplifier and operates as a buffer between node 662 and input node 666. Additionally, depending on the configuration of amplifier 668, amplifier 668 may modify a magnitude of the analog voltage received from node 662. The analog voltage received at input node 666 is converted by processor 664 into a digital value.

Referring to FIG. 4, detector 300 may include an optional output device 316 configured to generate a user-perceptible output based upon the digital voltage value received from voltage sensor 310. Output device 316 may include a display screen (e.g., an LCD screen). In that case, controller 314 may cause the display screen to display a representation of the digital voltage value received from voltage sensor 310. In that case, a user using detector 300 to test a heating appliance may place detector 300 in the heating cavity of the appliance being tested. With the RF heating system of the heating appliance operational, a user can read the current digital voltage value from the display screen. The user can then compare the displayed value with a range of known-good values previously determined to indicate appliance operation within specification. The known-good values can be determined by operating the detector within a number of known-good heating appliances (and, possibly, known-bad heating appliances). By determining the voltage values measured by detector during operation of the known-good and known-bad appliances, a range of known-good voltage values can then be determined based upon the digital voltage values displayed by the detector 300 (or similarly configured detectors 300) when testing the known-good and known-bad appliances.

In some cases, a memory within or accessible to controller 314 of detector 300 may be loaded with a range of known-good voltage values that indicate the RF heating system of a heating appliance is operating according to specification. In that case, controller 314 may itself compare the digital voltage value received from voltage sensor 310 to the known good values. If the received digital voltage value is within the range of the known-good voltage values, controller 314 may cause the display screen of output device 316 to generate an output message indicating that the heating appliance being tested is within specification. Conversely, if the received digital voltage value is not within the range of the known-good values, controller 314 may cause the display screen of output device 316 to generate a message indicate that the heating appliance being tested has failed to meet the specification.

In other optional embodiments, output device 316 may be implemented in any manner useful for communicating to a user a magnitude of the digital voltage value received from voltage sensor 310 or an indication of whether the RF heating system of the heating appliance being tested is within specification. In some cases, output device 316 may be implemented as an array of light emitting components (e.g., LEDs) in which the color of the light emitting components or the number of components illuminated may reflect the digital voltage value or an indication of whether the RF heating system is operating within specification. Alternatively, output device 316 may be an audible output device that controller 314 utilizes to generate an output tone, sound, or spoken message based upon the digital voltage value received from voltage sensor 310. The output sound may identify the magnitude of the received digital voltage value or may indicate that the RF heating system of heating appliance is within or is not within specification.

In some embodiments, detector 300 includes a wireless communication system 318 configured to transmit data to a remote computer system 320. Wireless communication system 318 may be configured to implement any suitable wireless communication protocol for transmitting data to a remote computer system. For example, wireless communication system 318 may be configured to implement a BLUETOOTH communication protocol or a WIFI communication protocol. Controller 314 may be configured to use wireless communication system 318 to transmit the digital data values received from voltage sensor 310 to the remote computer system 320. In that case, the remote computer system 320 may be configured to analyze the received voltage values to determine whether the RF heating system of the heating appliance being tested is operating within specification. Alternatively, controller 314 may be configured to compare the received digital voltage values to known-good values to determine whether the heating appliance is operating according to specification. Controller 314 can then use wireless communication system 318 to transmit an indication of whether the heating appliance is operating according to specification to remote computer system 320.

FIG. 6 depicts detector 600 including a BLUETOOTH wireless communication system 670 that the controller implemented by processor 664 may utilize to communicate data or indications of whether a heating appliance meets specification to a remote computer system. Although a BLUETOOTH wireless communication system is specifically mentioned herein, any other wireless communication system or protocol alternatively may be utilized.

As illustrated in FIGS. 3A-3C, 4, a number of the components of detector 300 are contained within housing 302. Housing 302 includes a top surface, walls, and a bottom surface so as to enclose those components within housing 302. Housing 302 is sized to fit within the heating cavity of the heating appliance. In some embodiments, housing 302 may be sized so that the location of detector 300 within the heating cavity is constrained to a precise location within the heating cavity ensuring consistent testing conditions for detector 300.

Housing 302 includes a conductive material, such as aluminum or other metals, and provides electrical isolation to voltage sensor 310, controller 314, output device 316, and wireless communication system 318. Antenna 306 is outside housing 302 necessarily, as antenna 306 must be exposed to the RF energy output of the RF heating system of the heating appliance. Additionally, RF-to-DC circuit 312 is positioned outside housing 302 so that energy passing though RF-to-DC circuit 312 is not conducted into housing 302. Voltage sensor 310 is electrically coupled to RF-to-DC circuit 312 by a wire that passes through a hole or opening formed in housing 302.

In a typical heating appliance implementation, the wavelength of the RF energy in the heating cavity will be relatively long as compared to the dimensions of housing 302. Specifically, for RF heating systems operating at frequency in the range of tens of MHz, the wavelength of the resulting RF energy will be on the order of meters long. Conversely, if the wireless communication system 318 is configured to implement BLUETOOTH or WIFI communication protocols, the wavelengths of those radio transmissions may be significantly shorter. For example, BLUETOOTH or WIFI data transmissions may occur at a frequency of 2.4 GHz having a wavelength of less than 1 meter and as short as 10 cm or shorter.

Because the wavelengths of the RF energy generated inside the heating cavity by the RF heating system are different from the wavelengths of signals carrying data transmissions from wireless communication system 318, it is possible to configure housing 302 so that housing 302 is not permeable to the RF energy generated by the RF heating system, but is permeable to the transmissions to or from wireless communication system 318. Such a housing 302 would continue to protect the components of detector 300 that are internal to housing 302 from the RF energy generated by the RF heating system, while enabling wireless communication system 318 to communicate with remote computer system 320, for example. In an embodiment, housing 302 is rendered permeable to the RF transmissions of wireless communication system 318 by forming a number of holes or openings in housing 302.

As seen in FIGS. 3A-3C, holes 324 are formed in the top, bottom, and side surfaces of housing 302. The size of the holes 324 are determined based upon both the wavelengths of the RF energy emitted by the RF heating systems that detector 300 is configured to test, as well as the wavelengths of the radio transmissions of the wireless communication system 318 of detector 300. For a given housing 302 and detector 300 implementation, experimentation and modeling may be used to predict optimal sizes and separation distances for holes 324 formed in housing 302.

In an embodiment in which detector 300 will operate in heating appliances with RF heating systems configured to operate at a frequency of approximately 40 MHz, with a wireless communication system 318 configured to operate at 2.4 GHz, holes 324 may each have diameters of approximately 7 millimeters (mm), with a minimum distance between holes 324 being approximately 10 mm. In other embodiments, housing 302 may include holes 324 having a minimum diameter greater than 5 mm and minimum distance between holes 324 of 8 mm. In that case, different holes 324 may have varying diameters and the distances between some of the holes 324 may vary as long as minimum diameter and minimum separation distance requirements are met.

In this configuration, holes 324 in housing 302 render housing 302 at least somewhat permeable to the transmissions of wireless communication system 318, while continuing to insulate the components of detector 300 inside housing 302 from the RF energy generated by the heating appliance's RF heating system.

In some embodiments, housing 302 may include low RF loss material and is configured to provide mechanical support to the components of detector 300. In that case, housing 302 may be permeable to the RF energy output by the RF heating system of a heating appliance. Such a housing 302 may be constructed using a foamed plastic material (e.g., Styrofoam), or a skeleton structure fabricated using a low RF loss material.

Detector 300 includes power source 326 configured to supply electrical energy to the components of detector 300 and, specifically, controller 314, wireless communication system 318 and optional output device 316. Power source 326 may be a battery or any other suitable source of electric energy. If implemented as a battery, power source 326 may be located within housing 302, as depicted in FIG. 4, so as to protect the battery power source 326 from the RF energy generated by the RF heating system being tested.

In some embodiments, however, power source 326 may be implemented as an energy harvesting system configured to absorb energy from the RF energy in the heating cavity of the heating appliance and use the energy to power the components of detector 300. If power source 326 is configured to harvest energy from the heating cavity, power source 326 may be positioned outside of housing 302 so as to be exposed to the RF energy emitted by the RF heating system.

In some embodiments, during a testing operation, detector 300 may be placed into a heating cavity of a heating appliance in combination with a test or dummy load 328. Dummy load 328 may be fixed to detector 300 (e.g., coupled to housing 302) or may be placed into the heating cavity separately.

Dummy load 328 may include an oil or other RF lossy material such as any lossy plastic (e.g., polymethyl methacrylate (PMMA)). If a liquid, dummy load 328 may be contained within a sealed container to prevent spillage during use of detector 300. If detector 300 includes or is intended to be used in conjunction with dummy load 328, when generating the known-good voltage values, as described above, detector 300 can be tested with known-good heating appliances using the same dummy load 328 so that the configuration of detector 300 used to generate the known-good values is of the same configuration as that ultimately used in testing heating appliances.

In some cases, different dummy loads 328 having different dielectric properties may be used in conjunction with detector 300. By utilizing different dummy loads 328 when testing a particular heating appliances, the performance of the RF heating system of the appliances can be tested in different loading conditions. In that case, different ranges of known-good digital voltage values may be determined for the different loads, so that detector 300 can be used to confirm the RF heating system of the heating appliance is operating in accordance with specifications for each of the loading conditions presented by each of the dummy loads 328.

In order to use a wireless detector (e.g., detector 300, 600) in testing heating appliances, a number of known-good heating appliances may be detected to determine, for a given output of the appliance's RF heating system, the resulting voltage that will be induced at the antenna (e.g., antenna 306, 606) of the detector.

To generate the known-good data, the detector may be placed inside a number (e.g., 10, 25, or 100) of different heating appliances. With the detector placed in each appliance, the appliances can be operated so that their respective RF heating systems output a target RF output power. For example, the various heating appliances may be operated so that they generate an output RF power of 100 watts (W). Then, for each appliance being tested the detector generates a voltage measurement based on the voltage being induced at the detector's antenna using, for example, RF-to-DC circuit 312 and voltage sensor 310 of FIG. 4. The voltage values measured for each RF heating system operating at 100 W can then be averaged together to determine a typical voltage measurement when the detector is operating within a heating appliance having an RF heating system outputting RF energy at 100 W.

This approach may be repeated so that the RF heating systems of known-good heating appliances can be tested at a number of different RF output power levels. By testing the RF heating systems at different output power levels, a number of different voltage values can be defined for the different RF power levels, where the values are indicative of the average voltage induced at the detector's antenna when positioned within a heating appliance having an RF heating system outputting RF energy at the associated power level. To illustrate, Table 1 shows the relationship between the RF power level of the RF heating system of an appliance being tested and the corresponding value of the voltage induced at the detector's antenna. As shown in the table, in a known-good device operating with an output RF power of 40 W, the voltage value received by the detector's controller (e.g., controller 314 of FIG. 4) from voltage sensor 310 is on average 500 millivolts (mV). The value 500 mV may be a real measurement of the voltage induced at the detector's antenna or may be a value having a magnitude determined by a magnitude of the induced voltage. Similarly, in a known-good device operating with an output RF power of 60 W, the value received by the detector's controller (e.g., controller 314 of FIG. 4) from voltage sensor 310 is on average 775 mV. The value 775 mV may be a real measurement of the voltage induced at the detector's antenna or may be a value determined by a magnitude of the induced voltage. As shown in Table 1, similar values may be determined at RF output powers of 80 W and 100 W.

TABLE 1

| RF Power Level | Value Indicated of Induced Voltage |
|---|---|
| 40 W | 500 mV |
| 60 W | 775 mV |
| 80 W | 990 mV |
| 100 W | 1195 mV |

With the average values of Table 1 determined for known-good RF heating systems at different output power levels, an appliance can be tested at those different power levels and evaluated to determine whether the appliance is operating within specifications. The specifications may require, for example, that in the unit being tested, the value measured by at the detector at different power levels must be within 5%, 10% or some other percentage of the average value determined for the known-good appliances. In other embodiments, different approaches for generating ranges of acceptable voltage values may be utilized. Different ranges may be defined using different approaches at different power levels. In some cases, the acceptable ranges for some power levels may be determined by regulations, while others may be determined by a manufacturer of a heating appliance.

Accordingly, for a given heating appliance, a table can be generated that lists for different target RF power levels the range of allowable voltage values that may be observed by the detector's controller. Table 2, below, provides an example of such a table. The first column specifies particular target RF power levels, the second column provides, for those power levels, the minimum acceptable voltage value that may be observed by the detector's controller, and the third column provides, for those power levels, the maximum acceptable voltage value that may be observed by the detector's controller.

TABLE 2

| RF Power Level | Minimum Acceptable Value | Maximum Acceptable Value |
|---|---|---|
| 40 W | 490 mV | 510 mV |
| 60 W | 765 mV | 790 mV |
| 80 W | 980 mV | 1000 mV |
| 100 W | 1180 mV | 1210 mV |

Accordingly, a heating appliance being tested may be determined to be operating within specifications if a detector positioned within the heating appliance's heating cavity measures voltage values between 1180 mV and 1210 mV when the RF heating system is instructed to output RF energy at a power level of 100 W. If, during such an operation, the detector measures voltage values less than 1180 mV or greater than 1210 mV, the heating appliance may be considered to not be within specification and the detector reports that the heating appliance has failed the test.

Figure 7:
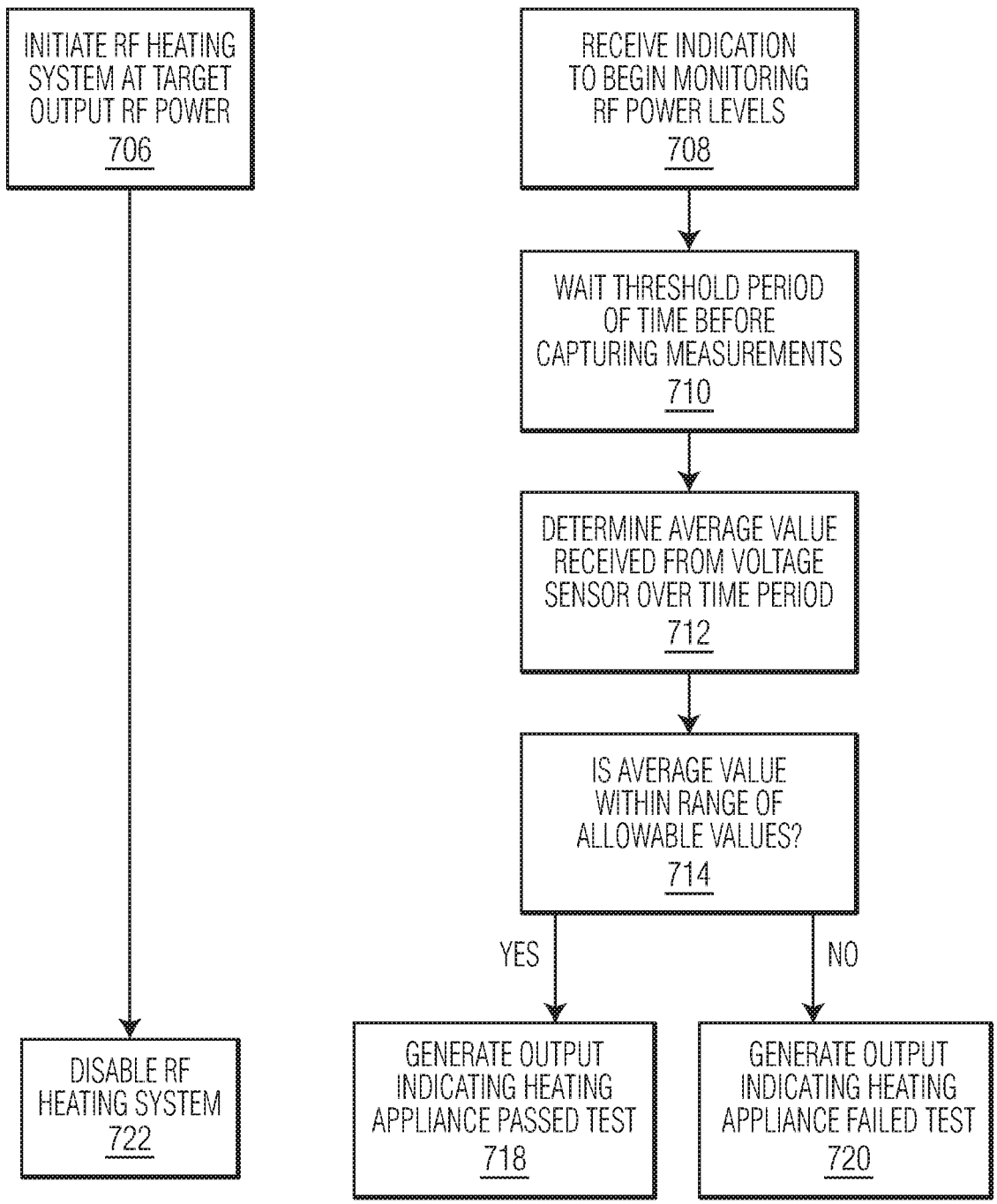
FIG. 7 is a flowchart depicting an example method for testing a heating appliance using a wireless detector.

FIG. 7 is a flowchart depicting an example method for testing a heating appliance 702 (e.g., heating appliance 100, FIG. 1) using a wireless detector 704 (e.g., detector 300, 600, FIGS. 3A-3C, 4, 5, 6). Steps 706 and 722 are performed by heating appliance 702. Steps 708, 710, 712, 714, 718, and 720 are performed by detector 704. Before the test can be initiated, detector 704 is positioned within the heating cavity of heating appliance 702. Such an arrangement is shown in FIG. 5 that depicts detector 300 being positioned within the heating cavity 301 of a heating appliance.

In a first step 706, the RF heating system of the heating appliance being tested is initiated. This may involve a user of the heating appliance providing input through a control panel (e.g., control panel 120 of FIG. 1) or another suitable user interface (e.g., user interface 292, FIG. 2) to cause the heating appliance to operate in a manner that will cause the appliance's RF heating system to generate RF output energy at a target desired power level (i.e., to produce an electromagnetic field within the cavity). For example, a user may directly input the desired RF output energy into the control panel or user interface, or may cause the heating appliance to operate in a particular mode that will cause the RF heating system to generate (or attempt to generate) the desired RF output energy. Alternatively step 706 may be implemented by a computer system (e.g., computer system 320 of FIG. 4) interfacing directly with a controller of the RF heating system (e.g., RF heating system controller 212, FIG. 2) to directly control the operation of the RF heating system and directly specify the target output power for the RF heating system.

With the RF heating system of the appliance being tested operational, in step 708, the controller (e.g., controller 314, FIG. 4) of detector 704 receives a notification that the detector is to begin monitoring RF power levels, as described herein. The notification may be received in any suitable manner. For example, the notification may be received by the controller from a remote computer system that instructs detector 704 to begin monitoring RF power levels. In that case, the instruction may be received by a wireless communication interface (e.g., via wireless communication system 318, FIG. 4) that is configured to communicate with the remote computer system. Alternatively, detector 704 may include a user interface enabling the user to press a button or activate another physical interface causing detector 704 to begin monitoring RF power levels.

At step 710, having received the instruction to being monitoring RF power levels, the controller of the detector executes a wait step in which the monitoring does not begin for a threshold period of time. This time period may be selected so that it provides sufficient time for the RF heating system to execute any necessary configuration or calibration routines before the RF heating system can begin outputting RF energy at the desired output power level (i.e., to produce an electromagnetic field within the cavity). Similarly, as the RF heating system operates, the wait time period allows the circuitry of the wireless detector 704 to become fully charged and able to accurately monitor the voltage in the detector's antenna. For example, with reference to the circuit diagram of detector 600 shown in FIG. 6, the series-connected capacitors 650a-650e may take some time to become fully charged once antenna 606 is positioned within an electric field causing a voltage to be induced at antenna 606. Accordingly, if detector 704 similarly includes a capacitor-based voltage divider network, or other components that must become fully charged before they can be fully operational, the time period specified in step 710 can allow those components to be fully charged enabling proper operation of detector 704. In some embodiments, the time delay implemented in step 710 may be on the order of 10 seconds, though differently configured detectors or heating appliances may require longer or shorter delays.

In step 712, for a period of time (e.g., 10 seconds or some other period of time) the controller of detector 704 periodically receives voltage values from the detector's voltage sensor (e.g., voltage sensor 310 of FIG. 4). Those values can then be averaged together to generate a single output value. By averaging several values together, the effect of potential outliers or erroneous measurements can be mitigated. For example, the controller may receive a voltage value from the voltage sensor once every second for the period of time. Those values are then averaged together to generate a single measurement value. In some embodiments of detector 704, the values received from the voltage sensor may be a direct measurement of the voltage induced in the antenna of detector 704. In other embodiments, as described herein, the magnitude of the values received from the voltage sensor may be determined by the magnitude of the voltage at the antenna.

While the controller receives values from the voltage sensor, the controller may be configured to optionally broadcast the values to the remote computer system. For example, using a wireless communications system (e.g., wireless communication system 318, FIG. 4), the controller can transmit the values received from the voltage sensor (or the calculated average value) to a remote computer system (e.g., computer system 320, FIG. 4).

In step 714, the controller of detector 704 determines whether the value determined in step 712 falls within the range of acceptable values indicating the RF output energy of the heating appliance begin tested is within specifications. This step involves identifying, for the power level of the RF heating system, the range of values that indicates operation with specification. The controller may be pre-programmed with the power level of the RF heating system that was used during the testing operation, or may receive an indication of the power level from a remote computer system via wireless communication system 318. In some embodiments, the controller may be preloaded with a data table that specifies, for the target output power level of the RF heating system being tested, a range of voltage values that indicate the heating appliance is operating within specification (see Table 2, above, as an example). In that case, in step 714, the controller may determine whether the value determined in step 712 falls within the specified range of values. If so, in step 718 the controller generates an output indicating that the heating appliance has met the test and the RF heating system is operating according to specification. The output may include combinations of audio/visual output generated by detector 704 itself (e.g., using an output device such as output device 316 of FIG. 4). Alternatively or additionally, the controller may generate the output by transmitting an indication that the heating appliance has met the test to a remote computer system (e.g., using a wireless communication system such as wireless communication system 318, FIG. 4).

Conversely, if in step 714 the controller determines the value determined in step 712 falls outside the specified range of values, the controller generates an output indicating that the heating appliance has not met the test and the RF heating system is not operating according to specification. The output may include combinations of audio/visual output generated by detector 704 itself (e.g., using an output device such as output device 316 of FIG. 4). Alternatively or additionally, the controller may generate the output by transmitting an indication that the heating appliance has not met the test to a remote computer system (e.g., using a wireless communication system such as wireless communication system 318, FIG. 4).

At step 722, the RF heating system being tested is disabled. The system may be disabled by a user providing an appropriate input to a control panel (e.g., control panel 120 of FIG. 1) or another suitable user interface (e.g., user interface 292, FIG. 2) of the heating appliance. Alternatively step 722 may be implemented by a computer system (e.g., computer system 320 of FIG. 4) interfacing directly with a controller of the RF heating system (e.g., RF heating system controller 212, FIG. 2) to cease operation of the RF heating system.

In the method depicted in FIG. 7, the controller of detector 704 can be configured to compare the voltage value determined in step 712 to threshold to evaluate when heating appliance 702 meets particular specifications. In an alternative embodiment, however, a detector may be configured to broadcast measured voltage values to a remote computer system enabling the remote computer system to perform the analysis of the measured voltage values and determine whether a particular heating appliance meets specifications.

Figure 8:
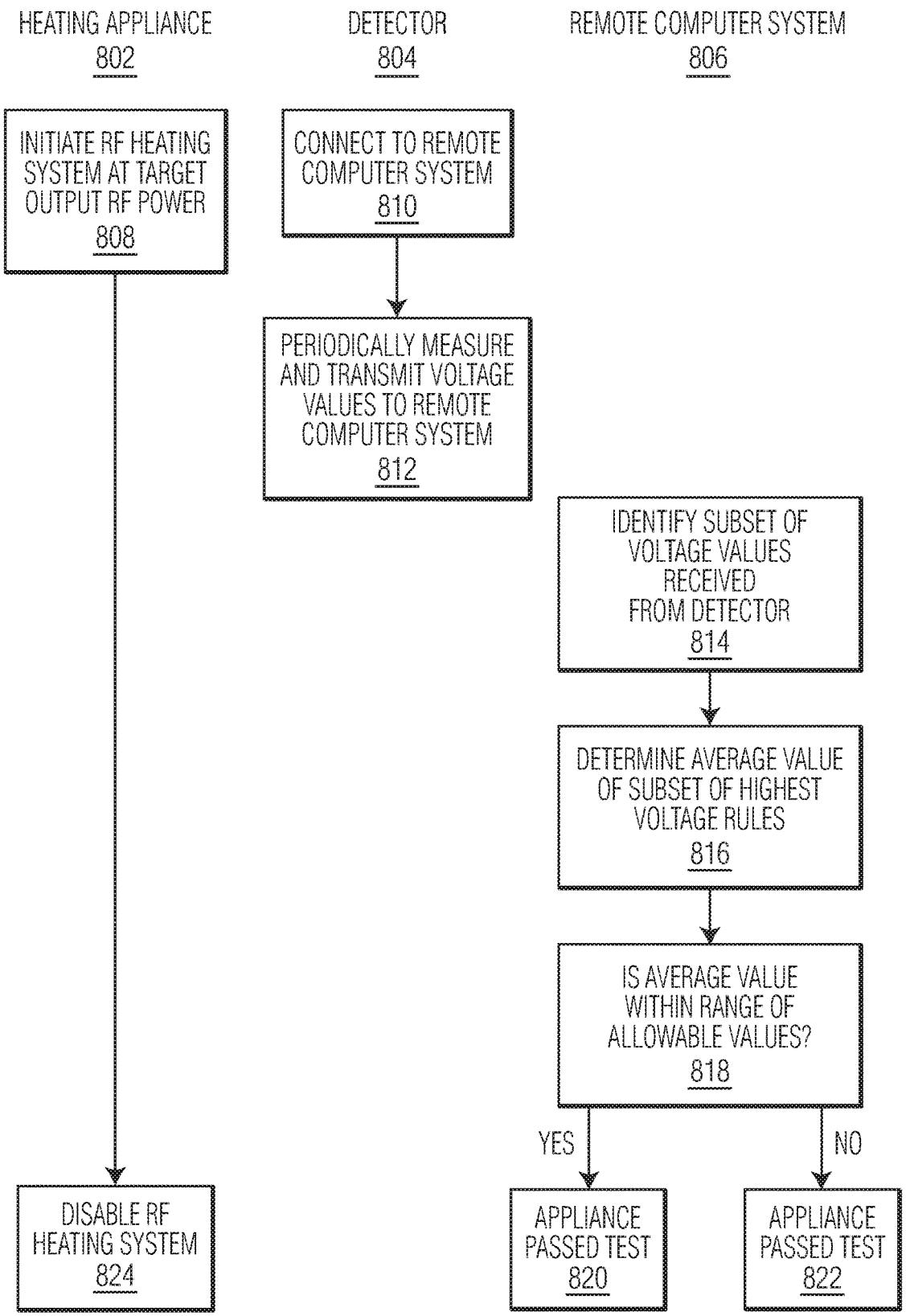
FIG. 8 is a flowchart depicting an example method for testing a heating appliance using a wireless detector and remote computer system.

Accordingly, FIG. 8 is a flowchart depicting an example method for testing a heating appliance 802 (e.g., heating appliance 100, FIG. 1) using a wireless detector 804 (e.g., detector 300, 600, FIGS. 3A-3C, 4, 5, 6) and remote computer system 806 (e.g., computer system 320, FIG. 4). Steps 808 and 824 are performed by heating appliance 802.

Steps 810 and 812 are performed by detector 804. Steps 814, 816, 818, 820, and 822 are performed by remote computer system 806. Before the test can be initiated, detector 804 is positioned within the heating cavity of heating appliance 802. Such an arrangement is shown in FIG. 5 that depicts detector 300 being positioned within the heating cavity 301 of a heating appliance.

In a first step 808, the RF heating system of the heating appliance being tested is initiated. This may involve a user of the heating appliance providing input through a control panel (e.g., control panel 120 of FIG. 1) or another suitable user interface (e.g., user interface 292, FIG. 2) to cause the heating appliance to operate in a manner that will cause the appliance's RF heating system to generate RF output energy at a target desired power level. Alternatively step 808 may be implemented by remote computer system 806 interfacing directly with a controller of the RF heating system (e.g., RF heating system controller 212, FIG. 2) to directly control the operation of the RF heating system and directly specify the target output power for the RF heating system.

With the RF heating system of the appliance being tested operational, in step 810, the controller (e.g., controller 314, FIG. 4) of detector 804 establishes a data connection with remote computer system 806. The connection may be established using a wireless communication system, such as wireless communication system 318 of FIG. 4. With the data connection established, in step 812 the controller of detector 804 periodically receives voltage values from the detector's voltage sensor (e.g., voltage sensor 310 of FIG. 4) and transmits those voltage values to remote computer system 806 using the data connection. The controller may receive a voltage value every second, for example, or may sample the voltage values at a different frequency.

Accordingly, remote computer system 806 receives a stream of voltage values from detector 804 pursuant to the execution of step 812. In step 814, after receiving the voltage values from detector 804, remote computer system 806 identifies a subset of the received voltage values for analysis. The subset can be selected to avoid anomalous values that do not accurately measure the voltage generated in the detector's antenna when the RF heating system of heating appliance 802 is operating at the desired RF output power. For example, the RF heating system may go through calibration or start-up routines that are performed periodically during a heating operation and that may be performed at a low power output. The subset of voltage values may be selected using any suitable approach. In an embodiment, the subset may simply be a number (e.g., 10) of the most-recently received voltage values from detector 804. In that case, the subset may be selected so that zero voltage values are ignored or skipped. Alternatively, the subset may include a number (e.g., 10) of the voltage values having the highest value.

With the subset determined, in step 814, remote computer system 806 determines the average value of the subset of voltage values identified in step 814. And in step 818, remote computer system 806 determines whether the value determined in step 816 falls within the range of acceptable values indicating the RF output energy of the heating appliance begin tested is within specifications. This step involves identifying, for the power level of the RF heating system, identifying the range of values that indicates operation with specification. If, in step 808 the power level was set by remote computer system 806, remote computer system 806 is already aware of the RF power level that was used by heating appliance 802 during the testing activity. Alternatively, the power level may be entered by a technician directly into remote computer system 806 are part of the testing activity. In some embodiments, remote computer system 806 may be preloaded with a data table that specifies, for the target output power level of the RF heating system being tested, a range of voltage values that indicate the heating appliance is operating within specification (see Table 2, above, as an example). In that case, in step 818, the controller may determine whether the value determined in step 816 falls within the specified range of values. If so, in step 820 remote computer system 806 generates an output indicating that the heating appliance has passed the test and the RF heating system is operating according to specification. The output may include combinations of audio/visual output. Conversely, if in step 818 the controller determines the value determined in step 816 falls outside the specified range of values, the controller generates an output indicating that the heating appliance has not met the test and the RF heating system is not operating according to specification. The output may include combinations of audio/visual output.

At step 824, the RF heating system being tested is disabled. The system may be disabled by a user providing an appropriate input to a control panel (e.g., control panel 120 of FIG. 1) or another suitable user interface (e.g., user interface 292, FIG. 2) of the heating appliance. Alternatively step 824 may be implemented by remote computer system 806 interfacing directly with a controller of the RF heating system (e.g., RF heating system controller 212, FIG. 2) of heating appliance 802 to cease operation of the RF heating system.

In an embodiment, a device includes an antenna configured to be disposed within a heating cavity of a heating appliance. The heating appliance includes an electrode configured to emit radio frequency energy into the heating cavity. The device includes a voltage sensor coupled to the antenna, a wireless communication system, and a controller coupled to the voltage sensor and the wireless communication system. The controller is configured to receive a first voltage measurement from the voltage sensor, and transmit, using the wireless communication system, an indication of the first voltage measurement to a remote computer system.

In another embodiment, a device includes an antenna configured to be disposed within a cavity of an appliance. The appliance includes an electrode and the antenna includes a sheet of conductive material having a surface area that is equal to or greater than a surface area of the electrode. The device includes a voltage sensor coupled to the antenna, an output device, and a controller coupled to the voltage sensor and the output device. The controller is configured to generate an output at the output device. The output is determined by a voltage of the antenna.

In another embodiment, a device includes an antenna configured to be disposed within a heating cavity of a heating appliance. The heating appliance includes an electrode configured to emit energy into the heating cavity. The device includes an output device configured to generate at least one of a visual output and an audio output, and a controller configured to generate an output at the output device. The output is determined by a voltage of the antenna.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A device configured to be positioned entirely within a heating cavity of a heating appliance, wherein the heating appliance includes an electrode configured to emit radio frequency energy into the heating cavity, the device comprising:
    a housing sized to fit within the heating cavity, wherein the housing is not permeable to the radio frequency energy emitted by the electrode, and the housing is permeable to transmissions to or from a wireless communication system;
    an antenna coupled to and positioned outside of the housing;
    a voltage sensor coupled to the antenna;
    the wireless communication system enclosed within the housing; and
    a controller enclosed within the housing and coupled to the voltage sensor and the wireless communication system, the controller being configured to:
        receive a first voltage measurement from the voltage sensor, and
        transmit, using the wireless communication system, an indication of the first voltage measurement to a remote computer system.

2. The device of claim 1, further comprising a voltage divider network coupled between the voltage sensor and the antenna.

3. The device of claim 2, wherein the voltage divider network includes a plurality of capacitors connected in series, and the antenna is directly electrically connected to a first terminal of a first capacitor in the plurality of capacitors, and the voltage sensor is directly electrically connected to a first terminal of a last capacitor in the plurality of capacitors, and the voltage sensor is directly electrically connected to a second terminal of a second-to-last capacitor in the plurality of capacitors.

4. The device of claim 1, wherein the wireless communication system is configured to implement a BLUETOOTH communication protocol or a WIFI communication protocol.

5. The device of claim 4, wherein the housing includes a layer of metal defining a plurality of holes, wherein each hole in the plurality of holes has a circular perimeter and a diameter of at least 5 millimeters, and each hole in the plurality of holes is separated from every other hole in the plurality of holes by at least 8 millimeters.

6. The device of claim 1, wherein the antenna includes a sheet of conductive material.

7. The device of claim 6, wherein a surface area of the antenna is equal to or greater than a surface area of the electrode.

8. The device of claim 1, wherein the controller is configured to:
    receive a second voltage measurement from the voltage sensor;
    calculate an average voltage measurement using the first voltage measurement and the second voltage measurement;
    determine that the average voltage measurement falls below a minimum threshold value; and
    transmit, using the wireless communication system, an indication that the heating appliance is not operating within specification to the remote computer system.

9. The device of claim 1, further comprising an output device configured to generate at least one of a visual output and an audio output, and wherein the controller is configured to generate the at least one of the visual output and the audio output based upon the first voltage measurement.

10. A device configured to be positioned entirely within a cavity of an appliance, wherein the appliance includes an electrode configured to emit radio frequency energy into the cavity, the device comprising:
    a housing sized to fit within the cavity, wherein the housing is not permeable to the radio frequency energy emitted by the electrode;
    an antenna coupled to and positioned outside of the housing, wherein the antenna includes a sheet of conductive material having a surface area that is equal to or greater than a surface area of the electrode;
    a voltage sensor coupled to the antenna;
    an output device; and
    a controller enclosed within the housing and coupled to the voltage sensor and the output device, the controller being configured to generate an output at the output device, wherein the output is determined by a voltage of the antenna.

11. The device of claim 10, further comprising a voltage divider network coupled between the voltage sensor and the antenna.

12. The device of claim 11, wherein the voltage divider network includes a plurality of capacitors connected in series, and the antenna is directly electrically connected to a first terminal of a first capacitor in the plurality of capacitors, and the voltage sensor is directly electrically connected to a first terminal of a last capacitor in the plurality of capacitors, and the voltage sensor is directly electrically connected to a second terminal of a second-to-last capacitor in the plurality of capacitors.

13. The device of claim 10, wherein the output device includes a wireless communication system configured to implement a BLUETOOTH communication protocol or a WIFI communication protocol.

14. The device of claim 10, the housing includes a layer of metal defining a plurality of holes, wherein each hole in the plurality of holes has a circular perimeter and a diameter of at least 5 millimeters, and each hole in the plurality of holes is separated from every other hole in the plurality of holes by at least 8 millimeters.

15. The device of claim 10, wherein the output device is configured to generate at least one of a visual output and an audio output.

16. A device configured to be positioned entirely within a cavity of an appliance that includes an electrode configured to emit radio frequency energy into the cavity, the device, the device comprising:
a housing sized to fit within the cavity, wherein the housing is not permeable to the radio frequency energy emitted by the electrode;
an antenna coupled to and positioned outside of the housing;
an output device configured to generate at least one of a visual output and an audio output; and
a controller enclosed within the housing and configured to generate an output at the output device, wherein the output is determined by a voltage of the antenna.

17. The device of claim 16, wherein the antenna includes a sheet of conductive material.

18. The device of claim 17, wherein a surface area of the antenna is equal to or greater than a surface area of the electrode.

19. The device of claim 16, further comprising a wireless communication system and wherein the controller is configured to transmit, using the wireless communication system, an indication of the voltage of the antenna to a remote computer system.

20. The device of claim 19, wherein the housing includes a layer of metal defining a plurality of holes, wherein each hole in the plurality of holes has a diameter of at least 5 millimeters and each hole in the plurality of holes is separated from every other hole in the plurality of holes by at least 8 millimeters.

* * * * *